(12) United States Patent
Eldridge et al.

(10) Patent No.: US 7,473,956 B2
(45) Date of Patent: Jan. 6, 2009

(54) ATOMIC LAYER DEPOSITION OF METAL OXIDE AND/OR LOW ASSYMMETRICAL TUNNEL BARRIER INTERPOLY INSULATORS

(75) Inventors: Jerome M. Eldridge, Los Gatos, CA (US); Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/929,986

(22) Filed: Aug. 30, 2004

(65) Prior Publication Data

US 2005/0023603 A1    Feb. 3, 2005

Related U.S. Application Data

(60) Division of application No. 10/081,818, filed on Feb. 20, 2002, which is a continuation-in-part of application No. 09/943,134, filed on Aug. 30, 2001, now Pat. No. 7,042,043.

(51) Int. Cl.
    *H01L 29/76* (2006.01)
(52) U.S. Cl. ................. 257/314; 257/239; 257/315; 257/325; 257/E29.129; 257/E29.274
(58) Field of Classification Search ............ 257/314, 257/315, E29.129
    See application file for complete search history.

(56) References Cited

U.S. PATENT DOCUMENTS

| | | | |
|---|---|---|---|
| 4,295,150 A | 10/1981 | Adam | |
| 4,412,902 A | 11/1983 | Michikami et al. | |
| 4,510,584 A | 4/1985 | Dias et al. | |
| 4,545,035 A | 10/1985 | Guterman et al. | |
| 4,556,975 A | 12/1985 | Smith et al. | |
| 4,665,417 A | 5/1987 | Lam | |
| 4,672,240 A | 6/1987 | Smith et al. | |
| 4,688,078 A | 8/1987 | Hseih | ........................ 257/321 |
| 4,757,360 A | 7/1988 | Faraone | |
| 4,780,424 A | 10/1988 | Holler et al. | |
| 4,939,559 A | 7/1990 | DiMaria et al. | ............... 257/38 |

(Continued)

OTHER PUBLICATIONS

Aarik, Jaan , et al., "Anomalous effect of temperature on atomatic layer deposition of titanium dioxide", *Journal of Crystal Growth*, 220(4), (Dec. 2000), 531-537.

(Continued)

*Primary Examiner*—Tu-Tu Ho
(74) *Attorney, Agent, or Firm*—Schwegman, Lundberg, Woessner & Kluth, P.A.

(57) ABSTRACT

Structures and methods for programmable array type logic and/or memory devices with asymmetrical low tunnel barrier intergate insulators are provided. The programmable array type logic and/or memory devices include non-volatile memory which has a first source/drain region and a second source/drain region separated by a channel region in a substrate. A floating gate opposing the channel region and is separated therefrom by a gate oxide. A control gate opposes the floating gate. The control gate is separated from the floating gate by an asymmetrical low tunnel barrier intergate insulator formed by atomic layer deposition. The asymmetrical low tunnel barrier intergate insulator includes a metal oxide insulator selected from the group consisting of $Al_2O_3$, $Ta_2O_5$, $TiO_2$, $ZrO_2$, $Nb_2O_5$, $SrBi_2Ta_2O_3$, $SrTiO_3$, $PbTiO_3$, and $PbZrO_3$.

50 Claims, 16 Drawing Sheets

U.S. PATENT DOCUMENTS

| | | | |
|---|---|---|---|
| 5,042,011 A | 8/1991 | Casper et al. | |
| 5,057,448 A | 10/1991 | Kuroda | |
| 5,071,782 A | 12/1991 | Mori | |
| 5,073,519 A | 12/1991 | Rodder ................. 438/269 | |
| 5,153,880 A | 10/1992 | Owen et al. | |
| 5,280,205 A | 1/1994 | Green et al. | |
| 5,315,142 A | 5/1994 | Acovic et al. | |
| 5,331,188 A | 7/1994 | Acovic et al. | |
| 5,338,953 A | 8/1994 | Wake | |
| 5,350,738 A | 9/1994 | Hase et al. | |
| 5,353,431 A | 10/1994 | Doyle et al. | |
| 5,399,516 A | 3/1995 | Bergendahl et al. | |
| 5,418,389 A | 5/1995 | Watanabe | |
| 5,429,966 A | 7/1995 | Wu et al. | |
| 5,474,947 A | 12/1995 | Chang et al. | |
| 5,488,612 A | 1/1996 | Heybruck ................. 714/725 | |
| 5,497,494 A | 3/1996 | Combs et al. | |
| 5,498,558 A | 3/1996 | Kapoor | |
| 5,508,544 A | 4/1996 | Shah ..................... 257/316 | |
| 5,576,567 A | 11/1996 | Mori | |
| 5,600,592 A | 2/1997 | Atsumi et al. | |
| 5,608,670 A | 3/1997 | Akaogi et al. | |
| 5,618,575 A | 4/1997 | Peter | |
| 5,618,761 A | 4/1997 | Eguchi et al. | |
| 5,619,051 A | 4/1997 | Endo | |
| 5,619,450 A | 4/1997 | Takeguchi | |
| 5,619,642 A | 4/1997 | Nielsen et al. | |
| 5,627,785 A | 5/1997 | Gilliam et al. | |
| 5,677,867 A | 10/1997 | Hazani | |
| 5,691,209 A | 11/1997 | Liberkowski | |
| 5,691,230 A | 11/1997 | Forbes | |
| 5,703,387 A | 12/1997 | Hong | |
| 5,705,415 A | 1/1998 | Orlowski et al. | |
| 5,739,544 A | 4/1998 | Yuki et al. | |
| 5,739,567 A | 4/1998 | Wong | |
| 5,751,038 A | 5/1998 | Mukherjee | |
| 5,768,192 A | 6/1998 | Eitan | |
| 5,798,548 A | 8/1998 | Fujiwara | |
| 5,801,401 A | 9/1998 | Forbes | |
| 5,852,306 A | 12/1998 | Forbes | |
| 5,880,991 A | 3/1999 | Hsu et al. | |
| 5,888,867 A | 3/1999 | Wang et al. | |
| 5,923,056 A | 7/1999 | Lee et al. | |
| 5,936,274 A | 8/1999 | Forbes et al. | |
| 5,952,692 A | 9/1999 | Nakazato et al. | |
| 5,959,465 A | 9/1999 | Beat ............. 326/39 | |
| 5,969,383 A | 10/1999 | Chang et al. | |
| 5,973,355 A | 10/1999 | Shirai et al. | |
| 5,981,350 A | 11/1999 | Geusic et al. | |
| 5,986,932 A | 11/1999 | Ratnakumar et al. | |
| 5,991,225 A | 11/1999 | Forbes et al. | |
| 6,009,011 A | 12/1999 | Yamauchi | |
| 6,025,228 A | 2/2000 | Ibok et al. | |
| 6,025,627 A | 2/2000 | Forbes et al. | |
| 6,031,263 A | 2/2000 | Forbes et al. | |
| 6,069,380 A | 5/2000 | Chou et al. | |
| 6,069,816 A | 5/2000 | Nishimura | |
| 6,077,745 A | 6/2000 | Burns, Jr. et al. | |
| 6,087,222 A | 7/2000 | Jung Lin et al. | |
| 6,087,695 A | 7/2000 | Chen | |
| 6,091,626 A | 7/2000 | Madan | |
| 6,093,606 A | 7/2000 | Lin et al. | |
| 6,108,240 A | 8/2000 | Lavi et al. | |
| 6,118,147 A | 9/2000 | Liu | |
| 6,118,159 A | 9/2000 | Willer et al. | |
| 6,124,608 A | 9/2000 | Liu et al. | |
| 6,124,729 A | 9/2000 | Noble et al. | |
| 6,130,453 A | 10/2000 | Mei et al. | |
| 6,134,175 A | 10/2000 | Forbes et al. | |
| 6,135,175 A | 10/2000 | Gaudreault et al. | |
| 6,141,238 A | 10/2000 | Forbes et al. | |
| 6,141,248 A | 10/2000 | Forbes et al. | |
| 6,143,636 A | 11/2000 | Forbes et al. | |
| 6,147,378 A | 11/2000 | Liu et al. | |
| 6,153,468 A | 11/2000 | Forbes et al. | |
| 6,157,061 A | 12/2000 | Kawata | |
| 6,163,049 A | 12/2000 | Bui | |
| 6,169,306 B1 | 1/2001 | Gardner et al. | |
| 6,180,461 B1 | 1/2001 | Ogura | |
| 6,180,980 B1 | 1/2001 | Wang | |
| 6,191,459 B1 | 2/2001 | Hofmann et al. | |
| 6,204,529 B1 | 3/2001 | Lung et al. | |
| 6,208,164 B1 | 3/2001 | Noble et al. | |
| 6,210,999 B1 | 4/2001 | Gardner et al. | |
| 6,229,175 B1 | 5/2001 | Uchida | |
| 6,238,976 B1 | 5/2001 | Noble et al. | |
| 6,246,606 B1 | 6/2001 | Forbes et al. | |
| 6,249,020 B1 | 6/2001 | Forbes et al. | |
| 6,249,460 B1 | 6/2001 | Forbes et al. | |
| 6,306,708 B1 | 10/2001 | Peng | |
| 6,307,775 B1 | 10/2001 | Forbes et al. | |
| 6,316,298 B1 | 11/2001 | Lee | |
| 6,317,364 B1 | 11/2001 | Guterman et al. | |
| 6,323,844 B1 | 11/2001 | Yeh et al. | |
| 6,335,554 B1 | 1/2002 | Yoshikawa | |
| 6,341,084 B2 | 1/2002 | Numata et al. | |
| 6,351,411 B2 | 2/2002 | Forbes et al. | |
| 6,376,312 B1 | 4/2002 | Yu | |
| 6,377,070 B1 | 4/2002 | Forbes ..................... 326/41 | |
| 6,396,745 B1 | 5/2002 | Hong et al. | |
| 6,404,681 B1 | 6/2002 | Hirano | |
| 6,424,001 B1 | 7/2002 | Forbes et al. | |
| 6,433,382 B1 | 8/2002 | Orlowski et al. | |
| 6,433,383 B1 * | 8/2002 | Ramsbey et al. ............ 257/315 | |
| 6,440,801 B1 | 8/2002 | Furukawa et al. | |
| 6,461,905 B1 | 10/2002 | Wang et al. | |
| 6,461,931 B1 | 10/2002 | Eldridge | |
| 6,465,836 B2 | 10/2002 | Lin et al. | |
| 6,475,857 B1 | 11/2002 | Kim et al. | |
| 6,476,434 B1 | 11/2002 | Noble et al. | |
| 6,504,207 B1 | 1/2003 | Chen et al. | |
| 6,514,842 B1 | 2/2003 | Prall et al. ................. 438/593 | |
| 6,519,176 B1 | 2/2003 | Hamzaoglu et al. | |
| 6,521,943 B1 | 2/2003 | Mine et al. | |
| 6,541,280 B2 | 4/2003 | Kaushik et al. | |
| 6,566,682 B2 | 5/2003 | Forbes | |
| 6,574,143 B2 | 6/2003 | Nakazato | |
| 6,580,124 B1 | 6/2003 | Cleeves et al. | |
| 6,586,797 B2 | 7/2003 | Forbes et al. | |
| 6,710,465 B2 | 3/2004 | Song et al. | |
| 6,730,575 B2 | 5/2004 | Eldridge ..................... 257/310 | |
| 6,740,928 B2 | 5/2004 | Yoshii et al. | |
| 6,753,568 B1 | 6/2004 | Nakazato et al. | |
| 6,753,571 B2 | 6/2004 | Kim et al. | |
| 6,754,108 B2 | 6/2004 | Forbes | |
| 6,778,441 B2 | 8/2004 | Forbes et al. | |
| 6,794,250 B2 | 9/2004 | Chang et al. | |
| 6,800,895 B2 | 10/2004 | Chang et al. | |
| 6,881,994 B2 | 4/2005 | Lee et al. | |
| 6,894,944 B2 | 5/2005 | Ishibashi et al. | |
| 6,903,367 B2 | 6/2005 | Forbes | |
| 6,950,340 B2 | 9/2005 | Bhattacharyya | |
| 6,952,032 B2 | 10/2005 | Forbes et al. | |
| 6,958,937 B2 | 10/2005 | Forbes et al. | |
| 6,963,103 B2 | 11/2005 | Forbes | |
| 7,027,328 B2 | 4/2006 | Forbes et al. | |
| 7,042,043 B2 | 5/2006 | Forbes et al. | |
| 7,068,544 B2 | 6/2006 | Forbes et al. | |
| 7,074,673 B2 | 7/2006 | Leonard | |
| 7,075,829 B2 | 7/2006 | Forbes | |
| 7,087,954 B2 | 8/2006 | Forbes | |
| 7,112,841 B2 | 9/2006 | Eldridge et al. | |
| 7,133,316 B2 | 11/2006 | Lue | |
| 7,135,734 B2 | 11/2006 | Eldridge et al. | |

| | | |
|---|---|---|
| 7,153,744 B2 | 12/2006 | Chen et al. |
| 7,154,138 B2 | 12/2006 | Hofmann et al. |
| 7,163,863 B2 | 1/2007 | Shone |
| 7,166,886 B2 | 1/2007 | Forbes |
| 7,205,601 B2 | 4/2007 | Lee et al. |
| 7,274,067 B2 | 9/2007 | Forbes |
| 7,372,096 B2 | 5/2008 | Forbes et al. |
| 7,372,097 B2 | 5/2008 | Forbes et al. |
| 7,391,072 B2 | 6/2008 | Forbes et al. |
| 2001/0013621 A1 | 8/2001 | Nakazato |
| 2001/0041250 A1 | 11/2001 | Werkhoven et al. |
| 2001/0055838 A1 | 12/2001 | Walker et al. |
| 2002/0008324 A1 | 1/2002 | Shinkawata |
| 2002/0024083 A1 | 2/2002 | Noble et al. |
| 2002/0028541 A1 | 3/2002 | Lee et al. |
| 2002/0106536 A1 | 8/2002 | Lee et al. |
| 2002/0109138 A1 | 8/2002 | Forbes |
| 2002/0109158 A1 | 8/2002 | Forbes et al. |
| 2002/0110973 A1 | 8/2002 | Liou et al. |
| 2002/0110983 A1 | 8/2002 | Liu et al |
| 2002/0137250 A1 | 9/2002 | Nguyen et al. |
| 2002/0176293 A1 | 11/2002 | Forbes et al. |
| 2003/0042528 A1 | 3/2003 | Forbes |
| 2003/0043637 A1 | 3/2003 | Forbes et al. |
| 2003/0134475 A1 | 7/2003 | Hofmann et al. |
| 2003/0207032 A1 | 11/2003 | Ahn et al. |
| 2003/0207540 A1 | 11/2003 | Ahn et al. |
| 2004/0032773 A1 | 2/2004 | Forbes |
| 2004/0160830 A1 | 8/2004 | Forbes |
| 2004/0207038 A1 | 10/2004 | Hofmann et al. |
| 2005/0023595 A1 | 2/2005 | Forbes et al. |
| 2005/0023602 A1 | 2/2005 | Forbes et al. |
| 2005/0024945 A1 | 2/2005 | Forbes |
| 2005/0026349 A1 | 2/2005 | Forbes et al. |
| 2005/0169054 A1 | 8/2005 | Forbes |
| 2006/0001049 A1 | 1/2006 | Forbes |
| 2006/0002192 A1 | 1/2006 | Forbes et al. |
| 2006/0170029 A1 | 8/2006 | Liu et al. |
| 2006/0186458 A1 | 8/2006 | Forbes et al. |
| 2006/0199338 A1 | 9/2006 | Eldridge et al. |
| 2006/0263981 A1 | 11/2006 | Forbes |
| 2006/0274580 A1 | 12/2006 | Forbes |
| 2006/0278917 A1 | 12/2006 | Forbes et al. |
| 2007/0018214 A1 | 1/2007 | Ahn |
| 2007/0138534 A1 | 6/2007 | Eldridge et al. |
| 2007/0145462 A1 | 6/2007 | Eldridge et al. |
| 2007/0170492 A1 | 7/2007 | Forbes et al. |
| 2007/0178635 A1 | 8/2007 | Eldridge et al. |
| 2007/0195608 A1 | 8/2007 | Forbes et al. |

OTHER PUBLICATIONS

Aarik, Jaan , et al., "Texture development in nanocrystalline hafnium dioxide thin films grown by atomic layer deposition", *Journal of Crystal Growth*, 220(1-2), (Nov. 15, 2000), 105-113.

Afanas'ev, V , et al., "Electron energy barriers between (100)Si and ultrathin stacks of SiO2, Al2O3, and ZrO3 and ZrO2 insulators", *Applied Physics Letters*, 78(20), (May 14, 2001), 3073-3075.

Arya, S. P., et al., "Conduction properties of thin Al/sub 2/O/sub 3/ films", *Thin Solid Films*, 91(4), (May 28, 1982), 363-374.

Dipert, Brian, "Flash Memory Goes Mainstream", *IEEE Spectrum*, 30(10), (Oct. 1993), 48-52.

Eierdal, L. , et al., "Interaction of oxygen with Ni(110) studied by scanning tunneling microscopy", *Surface Science*, 312(1-2), (Jun. 1994), 31-53.

Eldridge, J. M., et al., "Analysis of ultrathin oxide growth on indium", *Thin Solid Films*, 12(2), (Oct. 1972), 447-451.

Eldridge, J. M., et al., "Growth of Thin Pbo Layers on Lead Films. I. Experiment", *Surface Science*, 40(3), (Dec. 1973), 512-530.

Eldridge, J., et al., "Measurement of Tunnel Current Density in a Metal-Oxide-Metal System as a Function of Oxide Thickness", *Proc. 12th Intern. Conf. on Low Temperature Physics*, (1971), 427-428.

Ferguson, J D., et al., "Atomic layer depostion of Al2O3 and SiO2 on BN particles using sequential surface reactions", *Applied Surface Science*, 162-163, (Aug. 1, 2000), 280-292.

Greiner, J. , "Josephson Tunneling Barriers by rf Sputter Etching in an Oxygen Plasma", *Journal of Applied Physics*, 42(12), (Nov. 1971), 5151-5155.

Greiner, J. , "Oxidation of lead films by rf sputter etching in an oxygen plasma", *Journal of Applied Physics*, 45(1), (Jan. 1974), 32-37.

Grimblot, Jean , et al., "I. Interaction of Al films with O2 at low pressures", *Journal of the Electrochemical Society*, 129(10), (1982), 2366-2368.

Grimblot, J. , et al., "II. Oxidation of Aluminum Films", *Journal of the Electrochemical Society*, 129(10), (1982), 2369-2372.

Gundlach, K. , et al., "Logarithmic conductivity of Al-Al/sub 2/O/sub 3/-Al tunneling junctions produced by plasma- and by thermal-oxidation", *Surface Science*, 27(1), (Aug. 1971), 125-141.

Guo, X. , "High Quality Ultra-thin (1.5 nm) High quality ultra-thin (1.5 nm) TiO/sub 2/-Si/sub 3/N/sub 4/ gate dielectric for deep submicron CMOS technology", *International Electron Devices Meeting 1999. Technical Digest*(1999), 137-140.

Hodges, D. A., et al., "Analysis and Design of Digital Integrated Circuits", *McGraw-Hill Book Company, 2nd Edition*, (1988), 394-396.

Hodges, D. A., "Analysis and Design of Digital Integrated Circuits, 2nd Edition", *McGraw-Hill Publishing. New York*, (1988), 354-357.

Hurych, Z. , "Influence of Non-Uniform Thickness of Dielectric Layers on Capacitance and Tunnel Currents", *Solid-State Electronics*, 9, (1966), 967-979.

Itokawa, H , "Determination of Bandgap and Energy Band Alignment for High-Dielectric-Constant Gate Insulators Using High-Resolution X-ray Photoelectron Spectroscopy", *Extended Abstracts of the 1999 International Conference on Solid State Devices and Materials*, (1999), 158-159.

Kim, Yong S., et al., "Effect of rapid thermal annealing on the structure and the electrical properties of atomic-layer-deposited Ta2O5 films", *Journal of the Korean Physical Society*, (Dec. 2000), 975-979.

Kim, H. , "Leakage current and electrical breakdown in metal-organic chemical vapor deposited TiO/sub 2/ dielectrics on silicon substrates", *Applied Physics Letters*, 69(25), (Dec. 16, 1996), 3860-3862.

Kim, Yeong K., et al., "Novel capacitor technology for high density stand-alone and embedded DRAMs", *International Electron Devices Meeting 2000. Technical Digest. IEDM*, (2000), 369-372.

Kubaschewski, O. , et al., "Oxidation of Metals and Alloys", *Butterworths, London*, (1962), 53-63.

Kubaschewski, O. , et al., "Oxidation of Metals and Alloys,", *Butterworths, London*, Second Edition, (1962), 1-3, 5,6, 8-12, 24, 36-39.

Kukli, Kaupo , "Atomic Layer Deposition of Titanium Oxide from TiI4 and H2O2", *Chemical Vapor Deposition*, 6(6), (2000), 303-310.

Kukli, Kaupo , et al., "Atomic layer deposition of zirconium oxide from zirconium tetraiodide, water and hydrogen peroxide", *Journal of Crystal Growth*, 231(1-2), (Sep. 2001), 262-272.

Kukli, K. , "Development of Dielectric Properties of Niobium Oxide, Tantalum Oxide, and Aluminum Oxide Based Nanolayered Materials", *Journal of the Electrochemical Society*, 148(2), (Feb. 2001), F35-F41.

Kukli, Kaupo , et al., "Real-time monitoring in atomic layer deposition of TiO/sub 2/ from TiI/sub 4/ and H/sub 2/O-H/sub 2/", *Langmuir*, 16(21), (Oct. 17, 2000), 8122-8128.

Kwo, J. , "Properties of high k gate dielectrics Gd2O3 and Y2O3 for Si", *Journal of Applied Physics*, 89(7), (2001), 3920-3927.

Lee, J. , et al., "Effect of polysilicon gate on the flatband voltage shift and mobility degradation for ALD-Al/sub 2/O/sub 3/ gate dielectric", *International Electron Devices Meeting 2000. Technical Digest. IEDM*, (2000), 645-648.

Luan, H. F., "High Quality Ta2O5 Gate Dielectrics with Tox,eq<10A", *IEDM Technical Digest. International Electron Devices Meeting*, (Dec. 5-8, 1999), 141-143.

Ma, Yanjun , et al., "Zirconium oxide based gate dielectrics with equivalent oxide thickness of less than 1.0 nm and performance of submicron MOSFET using a nitride gate replacement process", *International Electron Devices Meeting 1999. Technical Digest*, (1999), 149-152.

Marshalek, R., et al., "Photoresponse Characteristics of Thin-Film Nickel-Nickel Oxide-Nickel Tunneling Junctions", *IEEE Journal of Quantum Electronics*, QE-19(4), (1983), 743-754.

Masuoka, F., et al., "A 256K Flash EEPROM using Triple Polysilicon Technology", *IEEE International Solid-State Circuits Conference, Digest of Technical Papers*, (1985), 168-169.

Masuoka, F., et al., "A New Flash EEPROM Cell using Triple Polysilicon Technology", *International Electron Devices Meeting, Technical Digest*, San Francisco, CA, (1984), 464-467.

Mori, S., et al., "Reliable CVD Inter-Poly Dielectrics for Advanced E&EEPROM", *Symposium on VSLI Technology, Digest of Technical Papers*, (1985), 16-17.

Muller, H., "Electrical and Optical Properties of Sputtered $In_2O_3$ Films", *Physica Status Solidi*, 27(2), (1968), 723-731.

Paranjpe, Ajit, et al., "Atomic layer deposition of AlOx for thin film head gap applications", *Journal of the Electrochemical Society*, 148(9), (Sep. 2001), 465-471.

Pashley, R., et al., "Flash Memories: the best of two worlds", *IEEE Spectrum*, 26(12), (Dec. 1989), 30-33.

Pollack, S., et al., "Tunneling Through Gaseous Oxidized Films of $Al_2O_3$", *Transactions of the Metallurigical Society of AIME*, 233, (1965), 497-501.

Qi, Wen-Jie, et al., "MOSCAP and MOSFET characteristics using $ZrO/sub 2/$ gate dielectric deposited directly on Si", *International Electron Devices Meeting 1999. Technical Digest*, (1999), 145-148.

Robertson, J., "Band offsets of wide-band-gap oxides and implifications for future electronic devices", *Journal of Vacuum Science & Technology B (Microelectronics and Nanometer Structures)*, 18(3), (May-Jun. 2000), 1785-1791.

Robertson, J., et al., "Schottky Barrier height of Tantalum oxide, barium strontium titanate, lead titanate, and strontium bismuth tantalate", *Applied Physics Letters*, 74(8), (Feb. 22, 1999), 1168-1170.

Shi, Ying, et al., "Tunneling Leakage Current in Ultrathin (<4nm) Nitride/Oxide Stack Dielectrics", *IEEE Electron Device Letters*, 19(10), (Oct. 1998), 388-390.

Simmons, J., "Generalized Formula for the Electric Tunnel Effect between Similar Electrodes Separated by a Thin Insulating Film", *Journal of Applied Physics*, 34(6), (1963), 1793-1803.

Smith, Ryan C., et al., "Chemical vapour deposition of the oxides of titanium, zirconium and hafnium for use as high-k materials in microelectronic devices. A carbon-free precursor for the synthesis of hafnium dioxide", *Advanced Materials for Optics and Electronics*, 10(3-5), (May-Oct. 2000), 105-106.

Swalin, R., "Eqilibrium betweem Phases of Variable Composition", *In: Thermodynamics of solids*, New York, J. Wiley, 2nd Edition,(1972), 165-180.

Sze, S., "Physics of Semiconductor Devices, Second Edition", *John Wiley & Sons, New York*, (1981), 553-556.

Yan, J., "Structural and electrical characterization of $TiO/sub 2/$ grown from titanium tetrakis-isopropoxide (TTIP) and $TTIP/H/sub 2/O$ ambients", *Journal of Vacuum Science & Technology B (Microelectronics and Nanometer Structures)*, 14(3), (May-Jun. 1996), 1706-1711.

Zhang, H., "Atomic layer deposition of high dielectric constant nanolaminates", *Journal of The Electrochemical Society*, 148(4), (Apr. 2001), F63-F66.

U.S. Appl. No. 11/062,543, filed Feb. 22, 2005, Sram Cells with Repressed Floating Gate Memory, Low Tunnel Barrier Interpoly Insulators.

U.S. Appl. No. 11/063,825, filed Feb. 23, 2005, Germanium-Silicon-Carbide Floating Gates in Memories.

U.S. Appl. No. 11/202,460, filed Aug. 12, 2005, Service Programmable Logic Arrays with Low Tunnel Barrier Interpoly Insulators.

U.S. Appl. No. 11/212,190, filed Aug. 26, 2005, Integrated Circuit Memory Device and Method.

U.S. Appl. No. 11/380,599, filed Apr. 27, 2006.

U.S. Appl. No. 11/470,008, filed Jun. 20, 2006.

U.S. Appl. No. 11/471,007, filed Jun. 20, 2006.

U.S. Appl. No. 11/471,348, filed Jun. 20, 2006.

U.S. Appl. No. 11/492,638, filed Jul. 25, 2006.

U.S. Appl. No. 11/492,637, filed Jul. 25, 2006.

Ahn, Kie Y., et al., "Magnesium Titanium Oxide Films", U.S. Appl. No.11/189,075, filed Jul. 25, 2005, 05-0381.

Eitan, Boaz, et al., "NROM: A Novel Localized Trapping, 2-Bit Nonvolatile Memory Cell", IEEE Electron Device Letters, 21(11), (Nov. 2000), 543-545.

"U.S. Appl. No. 09/943,134 Final Office action mailed Jan. 8, 2003", 13 pgs.

"U.S. Appl. No. 09/943,134 Notice of allowance mailed Apr. 7, 2005", 4 pgs.

"U.S. Appl. No. 09/943,134 Notice of allowance mailed Jun. 4, 2003", 5 pgs.

"U.S. Appl. No. 09/943,134 Notice of allowance mailed Nov. 5, 2004", 4 pgs.

"U.S. Appl. No. 09/943,134 Notice of allowance mailed Feb. 13, 2004", 4 pgs.

"U.S. Appl. No. 10/931,540 Notice of allowance mailed Apr. 20, 2005", 8 pgs.

"U.S. Appl. No. 10/931,540 Notice if allowance mailed Dec. 13, 2004", 12 pgs.

"U.S. Appl. No. 09/945,498 Notice of allowance mailed Dec. 3, 2002", 7 pgs.

"U.S. Appl. No. 09/945,498 Notice of allowance mailed Mar. 11, 2004", 4 pgs.

"U.S. Appl. No. 09/945,498 Notice of allowance mailed May 15, 2003", 6 pgs.

"U.S. Appl. No. 09/945,498 Notice of allowance mailed Sep. 10, 2003", 3 pgs.

"U.S. Appl. No. 09/945,395 Non/final office action mailed Nov. 6, 2002", 13 pgs.

"U.S. Appl. No. 09/945,395 Notice of allowance mailed Feb. 28, 2003", 9 pgs.

"U.S. Appl. No. 09/945,395 Notice of allowance mailed Jul. 30, 2003", 5 pgs.

"U.S. Appl. No. 09/945,395 Notice of allowance mailed Dec. 30, 2003", 4 pgs.

"U.S.Appl. No. 09/945,395 Response filed Feb. 6, 2003 to final office action mailed Nov. 6, 2002", 8 pgs.

"U.S. Appl. No. 09/945,500 Non/final office action mailed Dec. 24, 2002", 5 pgs.

"U.S. Appl. No. 09/945,500 Notice of allowance mailed Mar. 29, 2005", 4 pgs.

"U.S. Appl. No. 09/945,500 Notice of allowance mailed May 19, 2004",4 pgs.

"U.S. Appl. No. 09/945,500 Notice of allowance mailed Aug. 12, 2005, 2pgs.

"U.S. Appl. No. 09/945,500 Notice of allowance mailed Dec. 2, 2005", 2 pgs.

"U.S. Appl. No. 09/945,500 Notice of allowance mailed Dec. 12, 2003", 5pgs.

"U.S. Appl. No. 09/945,500 Response filed Mar. 24, 2003 to final office action mailed Dec. 24, 2002", 17 pgs.

"U.S. Appl. No. 09/945,507 Non/final office action mailed Jun. 17, 2003", 7pgs.

"U.S. Appl. No. 09/945,507 Notice of allowance mailed Mar. 9, 2004", 5 pgs.

"U.S. Appl. No. 09/945,507 Notice of allowance mailed Jun. 3, 2005", 2 pgs.

"U.S. Appl. No. 09/945,507 Notice of allowance mailed Nov. 3, 2003", 7 pgs.

"U.S. Appl. No. 09/945,507 Notice of allowance mailed Nov. 18, 2004", 7pgs.

"U.S. Appl. No. 09/945,507 Notice of allowance mailed Dec. 29, 2005", 2 pgs.

"U.S. Appl. No. 09/945,507 Response filed Oct. 17, 2003 to final office action mailed Jun. 17, 2003", 15 pgs.

"U.S. Appl. No. 09/945,512 Final office action mailed Oct. 13, 2005", 6 pgs.

"U.S. Appl. No. 09/945,512 Non final office action mailed Jun. 30, 2005", 8pgs.

"U.S. Appl. No. 09/945,512 Non/final office action mailed Dec. 20, 2002", 9 pgs.

"U.S. Appl. No. 09/945,512 Notice of allowance mailed Jan. 31, 2006", 4 pgs.

"U.S. Appl. No. 09/945,513 Notice of allowance mailed Feb. 22, 2005", 7 pgs.

"U.S. Appl. No. 09/945,512 Notice of allowance mailed May 27, 2004", 7 pgs.

"U.S. Appl. No. 09/945,512 Notice of allowance mailed Jun. 17 2003", 12 pgs.

"U.S. Appl. No. 09/945,512 Notice of allowance mailed Dec. 11, 2003", 7 pgs.

"U.S. Appl. No. 09/945,512 Response filed Jan. 13, 2006 to final office action mailed Jan. 28, 2006", 28 pgs.

"U.S. Appl. No. 09/945,512 Response filed Mar. 20, 2003 to non/final office action mailed Mar. 20, 2003", 30 pgs.

"U.S. Appl. No. 09/945,512 Response filed Sep. 29, 2005 to non/final office action mailed Sep. 29, 2005", 10 pgs.

"U.S. Appl. No. 09/945,554 Final office action mailed Mar. 12, 2004", 8 pgs.

"U.S. Appl. No. 09/945,554 Non/final office action mailed Oct. 22, 2003", 7 pgs.

"U.S. Appl. No. 09/945,554 Non/final office action mailed Dec. 13, 2002", 13 pgs.

"U.S. Appl. No. 09/945,554 Notice of allowance mailed May 2, 2003", 8 pgs.

"U.S. Appl. No. 09/945,554 Notice of allowance mailed Jun. 1, 2004", 2 pgs.

"U.S. Appl. No. 09/945,554 Notice of allowance mailed Nov. 22, 2004", 2 pgs.

"U.S. Appl. No. 09/945,554 Response filed Jan. 22, 2004 to final office action mailed Jan. 22, 2004", 35 pgs.

"U.S. Appl. No. 09/945,554 Response filed Mar. 13, 2003 to final office action mailed Mar. 13, 2003", 3 pgs.

"U.S. Appl. No. 09/945,554 Response filed May 12, 2004 to final office action mailed Mar. 12, 2004", 21 pgs.

"U.S. Appl. No. 10/028,001 non/final office action mailed Oct. 12, 2005", 12 pgs.

"U.S. Appl. No. 10/028,001 non/final office action mailed Nov. 2, 2004", 5pgs.

"U.S. Appl. No. 10/028,001 non/final office action mailed Feb. 14, 2003", 12 pgs.

"U.S. Appl. No. 10/028,001 Notice of allowance mailed Nov. 19, 2003", 4 pgs.

"U.S. Appl. No. 10/028,001 Notice of allowance mailed Feb. 1, 2006", 4 pgs.

"U.S. Appl. No. 10/028,001 Notice of allowance mailed Feb. 25, 2005", 4 pgs.

"U.S. Appl. No. 10/028,001 Notice of allowance mailed Apr. 16, 2004", 4 pgs.

"U.S. Appl. No. 10/028,001 Notice of allowance mailed Jun. 2, 2006", 3 pgs.

"U.S. Appl. No. 10/028,001 Notice of allowance mailed Jun. 3, 2003", 3 pgs.

"U.S. Appl. No. 10/028,001 Response filed Jan. 12, 2006 to non/final office action mailed Oct. 12, 2005", 15 pgs.

"U.S. Appl. No. 10/028,001 Response filed Feb. 2, 2005 to non/final office action mailed Nov. 2, 2004 pp. 12.pdf", 12 pgs.

"U.S. Appl. No. 10/028,001 Response filed May 14, 2003 to non/final office action mailed Feb. 14, 2003", 26 pgs.

"U.S. Appl. No. 10/789,038 Notice of allowance mailed Oct. 7, 2005", 11 pgs.

"U.S. Appl. No. 10/929,916 non/final office action mailed Jan. 26, 2006", 20 pgs.

"U.S. Appl. No. 10/929,916 non/final office action mailed Dec. 15, 2004", 4 pgs.

"U.S. Appl. No. 10/929,916 Notice of allowance mailed Apr. 28, 2005", 5 pgs.

"U.S. Appl. No. 10/929, 916 Notice of alllowance mailed Jun. 6, 2006", 4 pgs.

"U.S. Appl. No. 10/929,916 Response filed Mar. 15, 2005 to non/final office action mailed Dec. 15, 2004", 18 pgs.

"U.S. Appl. No. 10/929,916 Response filed Ap. 26, 2006 to non/final office action mailed Jan. 26, 2006", 27 pgs.

"U.S. Appl. No. 10/931,704 non/final office action mailed Apr. 19, 2007", 5 pgs.

"U.S. Appl. No. 10/028,001 Response filed Jan. 12, 2006 Non/Final Office Action mailed Oct. 12, 2005". 15 pgs.

"U.S. Appl. No. 10/028,001 Response filed Feb. 2, 2005 Non/Final Office Action mailed Nov. 2, 2004", 12 pgs.

"U.S. Appl. No. 10/028,001 Response filed May 14, 2003 Non/Final Office Action mailed Feb. 14, 2003",27 pgs.

"U.S. Appl. No. 10/081,818 Final office action mailed Oct. 5, 2005", 13 pgs.

"U.S. Appl. No. 10/081,818 Non/final office action mailed Jan. 2, 2003", 11 pgs.

"U.S. Appl. No. 10/081,818 Non/final office action mailed Mar. 24, 2006", 14 pgs.

"U.S. Appl. No. 10/081,818 Non/final office action mailed Apr. 29, 2005", 13 pgs.

"U.S. Appl. No. 10/081,818 Non/final office action mailed Oct. 15, 2004", 6 pgs.

"U.S. Appl. No. 10/081,818 Notice of allowance mailed Feb. 13, 2004", 4 pgs.

"U.S. Appl. No. 10/081,818 Notice of allowance mailed Feb. 22, 2005", 4 pgs.

"U.S. Appl. No. 10/081,818 Notice of allowance mailed Mar. 8, 2007", 3 pgs.

"U.S. Appl. No. 10/081,818 Notice of allowance mailed Sep. 21, 2006", 2 pgs.

"U.S. Appl. No. 10/081,818 Notice of allowance mailed Sep. 21, 2006", 5 pgs.

"U.S. Appl. No. 10/081,818 Notice of allowance mailed Sep. 26, 2003", 5 pgs.

"U.S. Appl. No. 10/081,818 Response filed Jan. 14, 2005 to non final office action mailed Oct. 15, 2004", 16 pgs.

"U.S. Appl. No. 10/081,818 Response filed Mar. 3, 2006 to final office action mailed Oct. 5, 2005", 14 pgs.

"U.S. Appl. No. 10/081,818 Response filed Apr. 2, 2003 to non final office action mailed Jan. 2, 2003", 12 pgs.

"U.S. Appl. No. 10/081,818 Response filed Jul. 29, 2005 to non final office action mailed Apr. 29, 2005", 21 pgs.

"U.S. Appl. No. 10/081,818 Response filed Jul. 29, 2005 to non final office action mailed Jul. 29, 2005", 21 pgs.

"U.S. Appl. No. 10/081,818 Response filed Aug. 24, 2006 to non final office action mailed Mar. 24, 2006", 16 pgs.

"U.S. Appl. No. 10/177,096 Non Final Office Action mailed Jun. 14, 2005", 18 pgs.

"U.S. Appl. No. 10/177,096 Non/Final Office Action mailed Jun. 10, 2003", 10 pgs.

"U.S. Appl. No. 10/177,096 Notice of Allowance mailed Apr. 6, 2004", 7 pgs.

"U.S. Appl. No. 10/177,096 Notice of Allowance mailed May 18, 2006", 7 pgs.

"U.S. Appl. No. 10/177,096 Notice of Allowance mailed Oct.6, 2005", 8 pgs.

"U.S. Appl. No. 10/177,096 Notice of Allowance mailed Nov. 14, 2003", 3 pgs.

"U.S. Appl. No. 10/177,096 Response filed Sep. 8, 2005 to non final office action mailed Sep. 8, 2005", 34 pgs.

"U.S. Appl. No. 10/177,096 Response filed Oct. 10, 2003 to non final office action mailed Oct. 10, 2003", 55 pgs.

"U.S. Appl. No. 10/781,035 Final office action mailed Oct. 5, 2205", 16 pgs.

"U.S. Appl. No. 10/781,035 Non/final office action mailed Jun. 2, 2005", 14 pgs.

"U.S. Appl. No. 10/781,035 Non/final office action mailed Jun. 22, 2004", 4 pgs.

"U.S. Appl No. 10/781,035 Notice of allowance mailed Jan. 30, 2206", 5 pgs.

"U.S. Appl. No. 10/781,035 Notice of allowance mailed Oct. 28, 2004", 5pgs.

"U.S. Appl. No. 10/781,035 Notice of allowance mailed May 18, 2006", 5 pgs.

"U.S. Appl. No. 10/781,035 Response filed Sep. 1, 2005 to non final office action mailed Sep. 2, 2005", 26 pgs.

"U.S. Appl. No. 10/781,035 Response filed Sep. 22, 2004 to non final office action mailed Jun. 22, 2004", 11 pgs.

"U.S. Appl. No. 10/781,035 Response filed Jan. 5, 2006 to final office action mailed Oct. 5, 2005", 20 pgs.

"U.S. Appl. No. 10/783,695 Non/final office action mailed Jul. 1, 2005", 8 pgs.

"U.S. Appl. No. 10/783,695 Notice of allowance mailed Aug. 22, 2006", 5 pgs.

"U.S. Appl. No. 10/783,695 Notice of allowance mailed Dec. 20, 2005", 4 pgs.

"U.S. Appl. No. 10/783,695 Response filed Oct. 3, 2005 to non final office action mailed Jul. 1, 2005", 24 pgs.

"U.S. Appl. No. 10/788,810 Non/final office action mailed Aug. 12, 2004", 15 pgs.

"U.S. Appl. No. 10/788,810 Notice of allowance mailed Jan. 9, 2006", 9 pgs.

"U.S. Appl. No. 10/788,810 Notice of allowance mailed Mar. 22, 2005", 7 pgs.

"U.S. Appl. No. 10/788,810 Notice of allowance mailed Jul. 28, 2005", 9 pgs.

"U.S. Appl. No. 10/788,810 Response filed Dec. 13, 2004 to no/final office action mailed Dec. 13, 2004", 22 pgs.

"U.S. Appl. No. 10/819,550 Non final office action mailed Sep. 21, 2004", 18 pgs.

"U.S. Appl. No. 10/819,550 Notice of allowance mailed Jan. 28, 2005", 7 pgs.

"U.S. Appl. No. 10/819,550 Response filed Dec. 21, 2004 to non/final office action mailed Dec. 21, 2004", 27 pgs.

"U.S. Appl. No. 10/926,916, Response filed Apr. 26, 2006 Non/Final Office Action mailed Jan. 26, 2006", 27 pgs.

"U.S. Appl. No. 10/931,704, Response filed Aug. 20, 2007 to Non/Final Office Action mailed Apr. 19, 2007", 10 pgs.

"U.S. Appl. No. 10/931,711 Final office action mailed Nov. 15, 2005", 12 pgs.

"U.S. Appl. No. 10/931,711 Non/final office action mailed Jun. 28, 2005", 24 pgs.

"U.S. Appl. No. 10/931,711 Notice of allowance mailed May 31, 2006", 9 pgs.

"U.S. Appl. No. 10/931,711 Notice of allowance mailed Sep. 18, 2006", 8 pgs.

"U.S. Appl. No. 10/931,711 Response filed Jan. 17, 2006 to final office action mailed Jan. 17, 2006", 28 pgs.

"U.S. Appl. No. 10/931,711 Response filed Sep. 28, 2005 to non/final office action mailed Sep. 28, 2005", 34 pgs.

"U.S. Appl. No. 10926,916, Response filed Mar. 15, 2005 Non/Final Office Action mailed Dec. 15, 2004", 18 pgs.

"U.S. Appl. No. 11/212190 Notice of allowance mailed Jan. 12, 2006", 6 pgs.

"U.S. Appl. No. 11/062,543 Non final office action mailed Aug. 14, 2006", 27 pgs.

"U.S. Appl. No. 11/062,543 Notice of Allowance mailed Jan. 26, 2007", 17 pgs.

"U.S. Appl. No. 11/062,543 Notice of allowance mailed Jun. 27, 2007", 20 pgs.

"U.S. Appl. No. 11/062,543 Response filed Nov. 3, 2006 to non final office action mailed Aug. 14, 2006", 20 pgs.

"U.S. Appl. No. 11/063,825 Non/final office action mailed Jun. 1, 2007", 15 pgs.

"U.S. Appl. No. 11/202,460 Non final office action mailed Jan. 4, 2007", 18 pgs.

"U.S. Appl. No. 11/202,460 Notice of allowance mailed May 17, 2007", 6 pgs.

"U.S. Appl. No. 11/202,460 Response filed Mar. 23, 2007 to non/final office action mailed Jan. 4, 2007", 17 pgs.

"U.S. Appl. No. 11/380,599 Non/final office action mailed Mar. 16, 2007", 21 pgs.

"U.S. Appl. No. 11/380,599 Notice of Allowance Mailed Aug. 16, 2007", NOAR, 8 pgs.

"U.S. Appl. No. 11/380,599 Response filed Jul. 13, 2007 to non/final office action mailed Mar. 16, 2007", 24 pgs.

"U.S. Appl. No. 11/471,007 Non/Final Office Action Mailed Aug. 16, 2007", OARN, 15 pgs.

"U.S. Appl. No. 11/471,008 Non Final Office Action Mailed Aug. 15, 2007", OARN, 17 pgs.

U.S. Appl. No. 11/471,348 Non/Final Office Action mailed Aug. 23, 2007, 12 pgs.

"U.S. Appl. No. 09/943,134 Amendment Under 37 CFR 1.312 mailed Jun. 10, 2005", 6 pgs.

"U.S. Appl. No. 09/943,134 Response filed Apr. 8, 2003 to Non Final Office Action mailed Jan. 8, 2003", 15 pgs.

"U.S. Appl. No. 09/945,395 Amendment Under 37 CFR 1.312 mailed Feb. 10, 2004", 15 pgs.

"U.S. Appl. No. 09/945,395 Amendment Under 37 CFR 1.312 mailed Apr. 17, 2003", 4 pgs.

"U.S. Appl. No. 09/945,512 Amendment filed Feb. 11, 2004", 23 pgs.

"U.S. Appl. No. 10/081,818, Response filed Jan. 14, 2005 Non-Final Office Action mailed Oct. 15, 2004", 8 pgs.

"U.S. Appl. No. 10/081,818, Response filed Mar. 3, 2006 Final Office Action mailed Oct. 5, 2005", 14 pgs.

"U.S. Appl. No. 10/783,695 Amendment Under 37CFR 1.312 mailed Nov. 20, 2006", 21 pgs.

"U.S. Appl. No. 10/789,038 Amendment Under 37 CFR 1.312 mailed Jan. 9, 2006", 10 pgs.

"U.S. Appl. No. 10/819,550 Amendment Under 37 CFR 1.312 mailed Mar. 31, 2005", 13 pgs.

"U.S. Appl. No. 10/931,540 Amendment Under 37 CFR 1.312 mailed May 12, 2005", 17 pgs.

"U.S. Appl. No. 10/931,704 Notice of Allowance mailed Sep. 21, 2007", NOAR, 14 pgs.

"U.S. Appl. No. 11/063,825, Response filed Aug. 31, 2007 to Non-Final Office Action mailed Jun. 1, 2007", 14 pgs.

* cited by examiner

| | $E_G$ | $\epsilon_r$ | $\epsilon_\infty$ | $\chi$ | $\phi_o$ (Pt) | $\phi_o$ (Al) |
|---|---|---|---|---|---|---|
| Conventional Insulators | | | | | | |
| $SiO_2$ | ~ 8 eV | 4 | 2.25 | 0.9 eV | | 3.2 eV |
| $Si_3N_4$ | ~ 5 eV | 7.5 | 3.8 | | | 2.4 eV |
| Metal Oxides | | | | | | |
| $Al_2O_3$ | 7.6 eV | 9 to 11 | 3.4 | | | ~ 2 eV |
| NiO | | | | | | |
| Transition Metal Oxides | | | | | | |
| $Ta_2O_5$ | 4.65 - 4.85 | | 4.8 | 3.3 | 2.0 | 0.8 eV |
| $TiO_2$ | 6.8 | 30 80 | 7.8 | 3.9 | est. 1.2 eV | |
| $ZrO_2$ | 5 - 7.8 | 18.5 25 | 4.8 | 2.5 | | 1.4 |
| $Nb_2O_5$ | 3.1 | 35-50 | | | | |
| $Y_2O_3$ | 6 | | 4.4 | | | 2.3 |
| $Gd_2O_3$ | | | | | | |
| Perovskite Oxides | | | | | | |
| $SrBi_2Ta_2O_3$ | 4.1 | | 5.3 | 3.3 | 2.0 | 0.8 eV |
| $SrTiO_3$ | 3.3 | | 6.1 | 3.9 | 1.4 | 0.2 eV |
| $PbTiO_3$ | 3.4 | | 6.25 | 3.5 | 1.8 | 0.6 eV |
| $PbZrO_3$ | 3.7 | | 4.8 | | est. 1.4 eV | 0.2 eV |

ATOMIC LAYER DEPOSITION OF METAL OXIDE AND/OR LOW ASSYMMETRICAL TUNNEL BARRIER INTERPOLY INSULATORS

CROSS REFERENCE TO RELATED APPLICATIONS

This application is a Divisional of U.S. Ser. No. 10/081,818 filed on Feb. 20, 2002, which is a Continuation-in-Part of U.S. Ser. No. 09/943,134 filed on Aug. 30, 2001, which applications are herein incorporated by reference.

This application is related to the following co-pending, commonly assigned U.S. patent applications: "DRAM Cells with Repressed Memory Metal Oxide Tunnel Insulators," Ser. No. 09/945,395, "Flash Memory with Low Tunnel Barrier Interpoly Insulators," Ser. No. 09/945,507, "Dynamic Electrically Alterable Programmable Memory with Insulating Metal Oxide Interpoly Insulators," Ser. No. 09/945,498, "Field Programmable Logic Arrays with Metal Oxide and/or Low Tunnel Barrier Interpoly Insulators," Ser. No. 09/945,512, "SRAM Cells with Repressed Floating Gate Memory, Metal Oxide Tunnel Interpoly Insulators," Ser. No. 09/945,554, "Programmable Memory Address and Decode Devices with Low Tunnel Barrier Interpoly Insulators," Ser. No. 09/945,500, and "Programmable Array Logic or Memory with P-Channel Devices and Asymmetrical Tunnel Barriers," Ser. No. 10/028,001, each of which disclosure is herein incorporated by reference.

FIELD OF THE INVENTION

The present invention relates generally to integrated circuits, and in particular to programmable array type logic and/or memory devices with asymmetrical low tunnel barrier interpoly insulators.

BACKGROUND OF THE INVENTION

Flash memories have become widely accepted in a variety of applications ranging from personal computers, to digital cameras and wireless phones. Both INTEL and AMD have separately each produced about one billion integrated circuit chips in this technology.

The original EEPROM or EARPROM and flash memory devices described by Toshiba in 1984 used the interpoly dielectric insulator for erase. (See generally, F. Masuoka et al., "A new flash EEPROM cell using triple polysilicon technology," IEEE Int. Electron Devices Meeting, San Francisco, pp. 464–67, 1984; F. Masuoka et al., "256K flash EEPROM using triple polysilicon technology," IEEE Solid-State Circuits Conf., Philadelphia, pp. 168–169, 1985). Various combinations of silicon oxide and silicon nitride were tried. (See generally, S. Mori et al., "reliable CVD inter-poly dialectics for advanced E&EEPROM," Symp. On VLSI Technology, Kobe, Japan, pp. 16–17, 1985). However, the rough top surface of the polysilicon floating gate resulted in, poor quality interpoly oxides, sharp points, localized high electric fields, premature breakdown and reliability problems.

Widespread use of flash memories did not occur until the introduction of the ETOX cell by INTEL in 1988. (See generally, U.S. Pat. No. 4,780,424, "Process for fabricating electrically alterable floating gate memory devices," 25 Oct. 1988; B. Dipert and L. Hebert, "Flash memory goes mainstream," IEEE Spectrum, pp. 48–51, October, 1993; R. D. Pashley and S. K. Lai, "Flash memories, the best of two worlds," IEEE Spectrum, pp. 30–33, December 1989). This extremely simple cell and device structure resulted in high densities, high yield in production and low cost. This enabled the widespread use and application of flash memories anywhere a non-volatile memory function is required. However, in order to enable a reasonable write speed the ETOX cell uses channel hot electron injection, the erase operation which can be slower is achieved by Fowler-Nordhiem tunneling from the floating gate to the source. The large barriers to electron tunneling or hot electron injection presented by the silicon oxide-silicon interface, 3.2 eV, result in slow write and erase speeds even at very high electric fields. The combination of very high electric fields and damage by hot electron collisions in the oxide result in a number of operational problems like soft erase error, reliability problems of premature oxide breakdown and a limited number of cycles of write and erase.

Other approaches to resolve the above described problems include; the use of different floating gate materials, e.g. SiC, SiOC, GaN, and GaAlN, which exhibit a lower work function (see FIG. 1A), the use of structured surfaces which increase the localized electric fields (see FIG. 1B), and amorphous SiC gate insulators with larger electron affinity, $\chi$, to increase the tunneling probability and reduce erase time (see FIG. 1C).

One example of the use of different floating gate (FIG. 1A) materials is provided in U.S. Pat. No. 5,801,401 by L. Forbes, entitled "FLASH MEMORY WITH MICROCRYSTALLINE SILICON CARBIDE AS THE FLOATING GATE STRUCTURE." Another example is provided in U.S. Pat. No. 5,852,306 by L. Forbes, entitled "FLASH MEMORY WITH NANOCRYSTALLINE SILICON FILM AS THE FLOATING GATE." Still further examples of this approach are provided in pending applications by L. Forbes and K. Ahn, entitled "DYNAMIC RANDOM ACCESS MEMORY OPERATION OF A FLASH MEMORY DEVICE WITH CHARGE STORAGE ON A LOW ELECTRON AFFINITY GaN OR GaAIN FLOATING GATE," Ser. No. 08/908,098, and "VARIABLE ELECTRON AFFINITY DIAMOND-LIKE COMPOUNDS FOR GATES IN SILICON CMOS MEMORIES AND IMAGING DEVICES," Ser. No. 08/903452.

An example of the use of the structured surface approach (FIG. 1B) is provided in U.S. Pat. No. 5,981,350 by J. Geusic, L. Forbes, and K. Y. Ahn, entitled "DRAM CELLS WITH A STRUCTURE SURFACE USING A SELF STRUCTURED MASK." Another example is provided in U.S. Pat. No. 6,025,627 by L. Forbes and J. Geusic, entitled "ATOMIC LAYER EXPITAXY GATE INSULATORS AND TEXTURED SURFACES FOR LOW VOLTAGE FLASH MEMORIES."

Finally, an example of the use of amorphous SiC gate insulators (FIG. 1C) is provided in U.S. patent application Ser. No. 08/903,453 by L. Forbes and K. Ahn, entitled "GATE INSULATOR FOR SILICON INTEGRATED CIRCUIT TECHNOLOGY BY THE CARBURIZATION OF SILICON."

Additionally, graded composition insulators to increase the tunneling probability and reduce erase time have been described by the same inventors. (See, L. Forbes and J. M. Eldridge, "GRADED COMPOSITION GATE INSULATORS TO REDUCE TUNNELING BARRIERS IN FLASH MEMORY DEVICES," application Ser. No. 09/945,514.

However, all of these approaches relate to increasing tunneling between the floating gate and the substrate such as is employed in a conventional ETOX device and do not involve tunneling between the control gate and floating gate through and inter-poly dielectric.

Therefore, there is a need in the art to provide improved programmable array type logic and/or memory devices while avoiding the large barriers to electron tunneling or hot electron injection presented by the silicon oxide-silicon interface, 3.2 eV, which result in slow write and erase speeds even at very high electric fields. There is also a need to avoid the combination of very high electric fields and damage by hot electron collisions in the which oxide result in a number of operational problems like soft erase error, reliability problems of premature oxide breakdown and a limited number of cycles of write and erase. Further, when using an interpoly dielectric insulator erase approach, the above mentioned problems of having a rough top surface on the polysilicon floating gate which results in, poor quality interpoly oxides, sharp points, localized high electric fields, premature breakdown and reliability problems must be avoided.

SUMMARY OR THE INVENTION

The above mentioned problems with programmable array type logic and/or memory devices and other problems are addressed by the present invention and will be understood by reading and studying the following specification. Systems and methods are provided for programmable array type logic and/or memory devices with asymmetrical, low tunnel barrier interpoly insulators.

In one embodiment of the present invention, a non-volatile memory cell, or floating gate transistor, includes a first source/drain region and a second source/drain region separated by a channel region in a substrate. A floating gate opposes the channel region and is separated therefrom by a gate oxide. A control gate opposes the floating gate. The control gate is separated from the floating gate by an asymmetrical low tunnel barrier intergate insulator. The low tunnel barrier intergate insulator includes a metal oxide insulator selected from the group consisting of $Al_2O_3$, $Ta_2O_5$, $TiO_2$, $ZrO_2$, $Nb_2O_5$, $SrBi_2Ta_2O_3$, $SrTiO_3$, $PbTiO_3$, and $PbZrO_3$. The floating gate includes a polysilicon floating gate having a metal layer formed thereon in contact with the low tunnel barrier intergate insulator. And, the control gate includes a polysilicon control gate having a metal layer, having a different work function from the metal layer formed on the floating gate, formed thereon in contact with the low tunnel barrier intergate insulator.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1A:
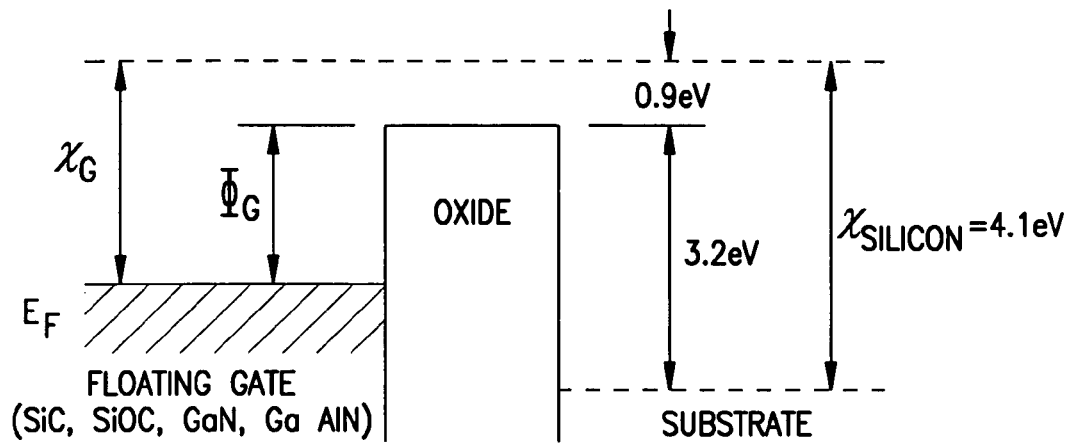
FIGS. 1A–1C illustrate a number of previous methods for reducing tunneling barriers in Flash memory.
Figure 1B:
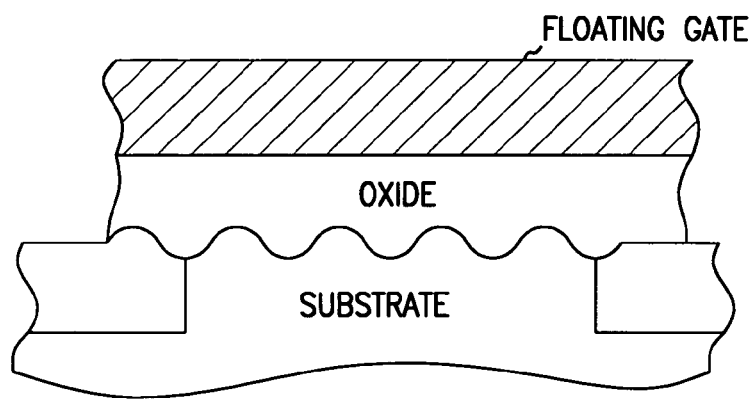
Figure 1C:
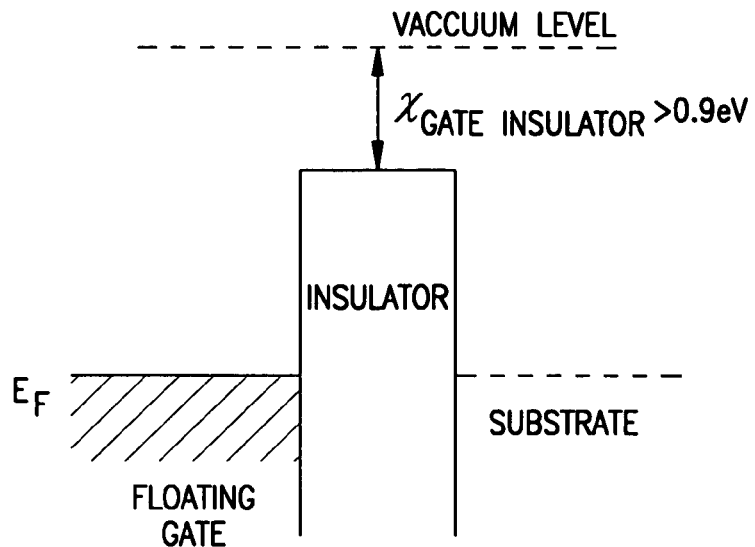
Figure 2:
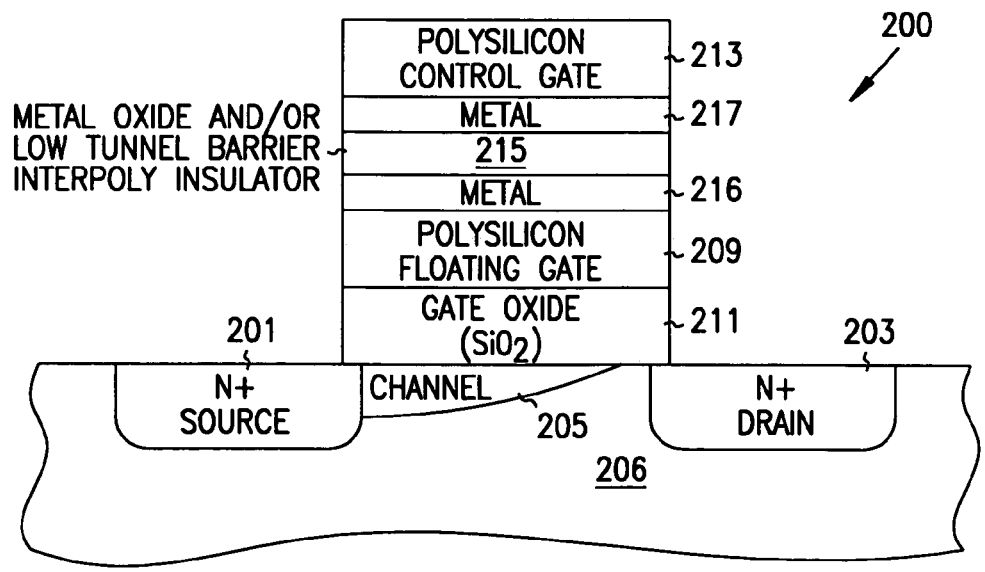
FIG. 2 illustrates one embodiment of a floating gate transistor, or non-volatile memory cell, according to the teachings of the present invention.

The present invention, describes the use of asymmetrical metal oxide inter-poly dielectric insulators, formed by atomic layer deposition (ALD), between the control gate and the floating gate of non-volatile memory cells. An example is shown in FIG. 2 for a planar structure, or horizontal non-volatile memory cell. This non-volatile memory cell, as described herein, can then be implemented in a number of programmable array type logic and/or memory devices according to the teachings of the present invention.

According to the teachings of the present invention. The use of an asymmetrical metal oxide films, formed by atomic layer deposition (ALD), for this purpose offer a number of advantages including:

(i) Flexibility in selecting a range of smooth metal film surfaces and compositions that can be oxidized to form tunnel barrier insulators.

(ii) Employing simple "low temperature oxidation" to produce oxide films of highly controlled thickness, composition, purity and uniformity.

(iii) Avoiding inadvertent inter-diffusion of the metal and silicon as well as silicide formation since the oxidation can be carried out at such low temperatures.

(iv) Using metal oxides that provide desirably lower tunnel barriers, relative to barriers currently used such as $SiO_2$.

(v) Providing a wide range of higher dielectric constant oxide films with improved capacitance characteristics.

(vi) Providing a unique ability to precisely tailor tunnel oxide barrier properties for various device designs and applications.

(vii) Permitting the use of thicker tunnel barriers, if needed, to enhance device performance and its control along with yield and reliability.

(viii) Developing layered oxide tunnel barriers by atomic layer deposition on multiple oxide layers in order, for example, to enhance device yields and reliability more typical of single insulating layers.

(ix) Eliminating soft erase errors caused by the current technique of tunnel erase from floating gate to the source.

FIG. 2 illustrates one embodiment of a floating gate transistor, or non-volatile memory cell 200, according to the teachings of the present invention. As shown in FIG. 2, the non-volatile memory cell 200 includes a first source/drain region 201 and a second source/drain region 203 separated by a channel region 205 in a substrate 206. A floating gate 209 opposes the channel region 205 and is separated therefrom by a gate oxide 211. A control gate 213 opposes the floating gate 209. According to the teachings of the present invention, the control gate 213 is separated from the floating gate 209 by an asymmetrical low tunnel barrier intergate insulator 215.

In one embodiment of the present invention, the asymmetrical low tunnel barrier intergate insulator 215 includes an asymmetrical metal oxide insulator which is aluminum oxide ($Al_2O_3$). In an alternative embodiment of the present invention, the asymmetrical low tunnel barrier intergate insulator 215 includes an asymmetrical transition metal oxide selected from the group consisting of $Ta_2O_5$, $TiO_2$, $ZrO_2$, and $Nb_2O_5$. In still another alternative embodiment of the present invention, the asymmetrical low tunnel barrier intergate insulator 215 includes an asymmetrical Perovskite oxide tunnel barrier selected from the group consisting of $SrBi_2Ta_2O_3$, $SrTiO_3$, $PbTiO_3$, and $PbZrO_3$ According to the teachings of the present invention, the floating gate 209 includes a polysilicon floating gate 209 having a metal layer 216 formed thereon in contact with the asymmetrical low tunnel barrier intergate insulator 215. Likewise, the control gate 213 includes a polysilicon control gate 213 having a metal layer 217, having a work function different from the metal layer 216 formed on the floating gate 209, formed thereon in contact with the asymmetrical low tunnel barrier intergate insulator 215. In one embodiment, metal layer 216 is formed of the same metal material used to form the asymmetrical metal oxide interpoly insulator 215. As stated above, the non-volatile memory cell, as described herein, can then be implemented in a number of programmable array type logic and/or memory devices according to the teachings of the present invention.

Figure 3:
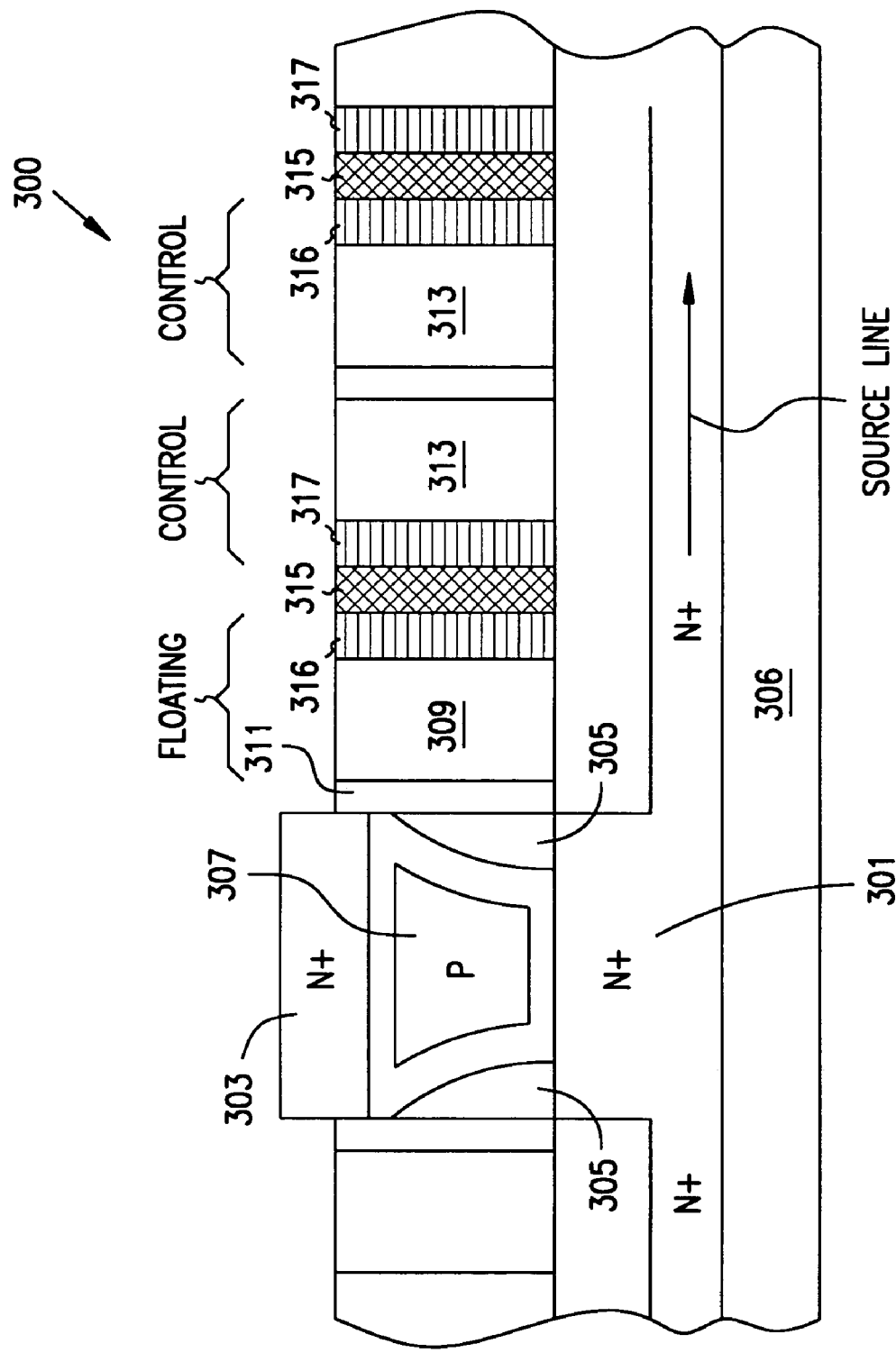
FIG. 3 illustrates another embodiment of a floating gate transistor, or non-volatile memory cell, according to the teachings of the present invention.

FIG. 3 illustrates another embodiment of a floating gate transistor, or non-volatile memory cell 300, according to the teachings of the present invention. As shown in the embodiment of FIG. 3, the non-volatile memory cell 300 includes a vertical non volatile memory cell 300. In this embodiment, the non-volatile memory cell 300 has a first source/drain region 301 formed on a substrate 306. A body region 307 including a channel region 305 is formed on the first source/drain region 301. A second source/drain region 303 is formed on the body region 307. Methods for forming such a vertical transistor structure are disclosed in U.S. Pat. No. 6,135,175, entitled "Memory Address Decode Array with vertical transistors, which is incorporated herein by reference. A floating gate 309 opposes the channel region 305 and is separated therefrom by a gate oxide 311. A control gate 313 opposes the floating gate 309. According to the teachings of the present invention, the control gate 313 is separated from the floating gate 309 by an asymmetrical low tunnel barrier intergate insulator 315.

In one embodiment of the present invention, low tunnel barrier intergate insulator 315 includes an asymmetrical metal oxide insulator which is aluminum oxide ($Al_2O_3$). In an alternative embodiment of the present invention, the asymmetrical low tunnel barrier intergate insulator 315 includes an asymmetrical transition metal oxide selected from the group consisting of $Ta_2O_5$, $TiO_2$, $ZrO_2$, and $Nb_2O_5$. In still another alternative embodiment of the present invention, the low tunnel barrier intergate insulator 315 includes an asymmetrical Perovskite oxide tunnel barrier selected from the group consisting of $SrBi_2Ta_2O_3$, $SrTiO_3$, $PbTiO_3$, and $PbZrO_3$.

The floating gate 309 includes a polysilicon floating gate 309 having a metal layer 316 formed thereon in contact with the asymmetrical low tunnel barrier intergate insulator 315. The control gate 313 includes a polysilicon control gate 313 having a metal layer 317, having a work function different from the metal layer 316 formed on the floating gate 309, formed thereon in contact with the asymmetrical low tunnel barrier intergate insulator 315. As stated above, the non-volatile memory cell, as described herein, can then be implemented in a number of programmable array type logic and/or memory devices according to the teachings of the present invention.

As shown in FIG. 3, the floating gate 309 includes a vertical floating gate 309 formed alongside of the body region 307. In the embodiment shown in FIG. 3, the control gate 313 includes a vertical control gate 313 formed alongside of the vertical floating gate 309.

As will be explained in more detail below, the floating gate 309 and control gate 313 orientation shown in FIG. 3 is just one embodiment for a vertical non volatile memory cell 300, according to the teachings of the present invention. In other embodiments, explained below, the floating gate includes a horizontally oriented floating gate formed alongside of the body region. In this alternative embodiment, the control gate includes a horizontally oriented control gate formed above the horizontally oriented floating gate.

Figure 4:
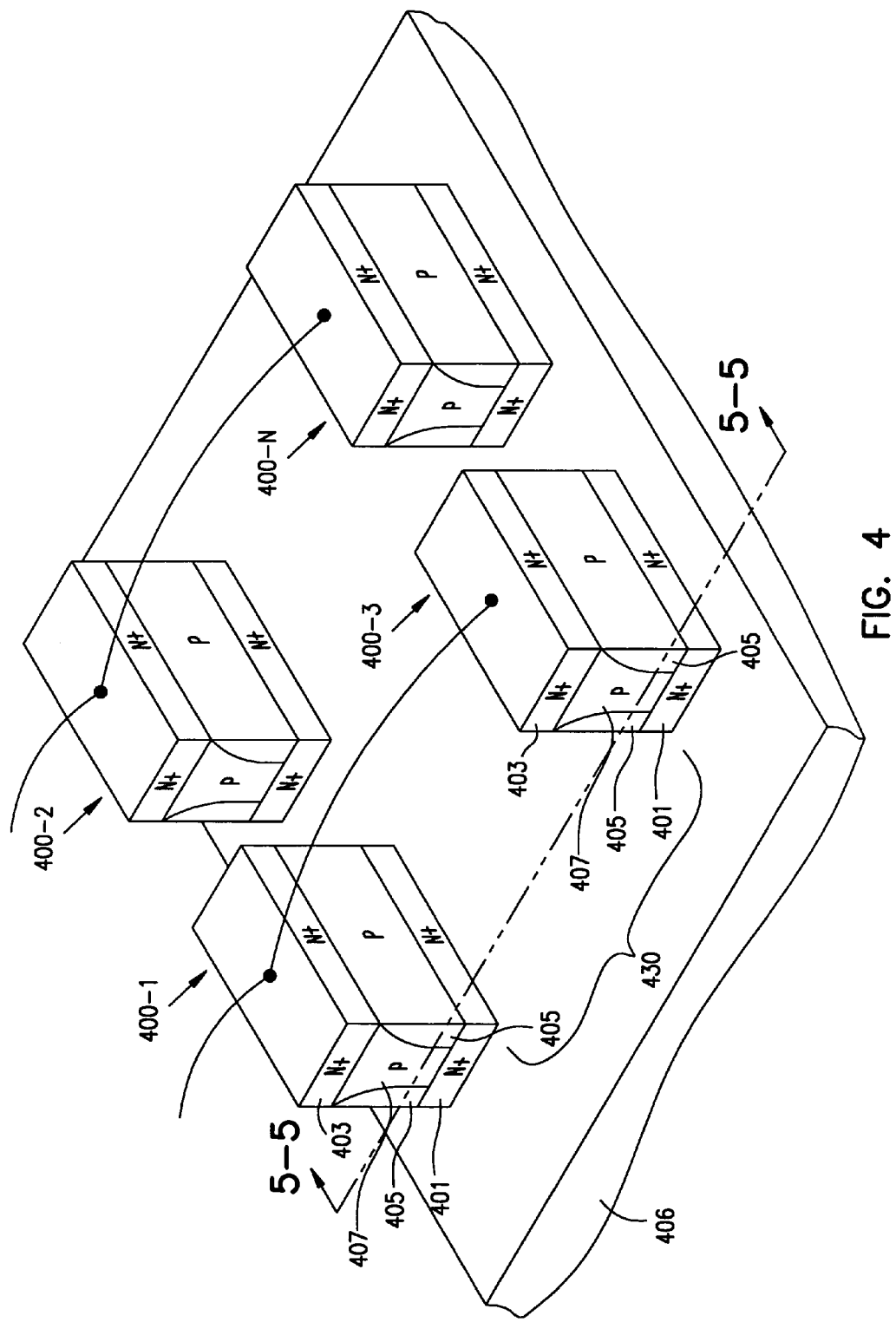
FIG. 4 is a perspective view illustrating an array of silicon pillars formed on a substrate as used in one embodiment according to the teachings of the present invention.

FIG. 4 is a perspective view illustrating an array of silicon pillars 400-1, 400-2, 400-3, . . . , 400-N, formed on a substrate 406 as used in one embodiment according to the teachings of the present invention. As will be understood by one of ordinary skill in the art upon reading this disclosure, the substrates can be (i) conventional p-type bulk silicon or p-type epitaxial layers on p+ wafers, (ii) silicon on insulator formed by conventional SIMOX, wafer bonding and etch back or silicon on sapphire, or (iii) small islands of silicon on insulator utilizing techniques such as described in more detail in U.S. Pat. No. 5,691,230, by Leonard Forbes, entitled "Technique for Producing Small Islands of Silicon on Insulator," issued Nov. 25, 1997, which is incorporated herein by reference.

As shown in FIG. 4, each pillar in the array of silicon pillars 400-1, 400-2, 400-3, ..., 400-N, includes a first source/drain region 401 and a second source/drain region 403. The first and the second source/drain regions, 401 and 403, are separated by a body region 407 including channel regions 405. As shown in FIG. 4, a number of trenches 430 separate adjacent pillars in the array of silicon pillars 400-1, 400-2, 400-3, ..., 400-N. Trenches 430 are referenced in connection with the discussion which follows in connection with FIGS. 5A–5E.

Figure 5A:
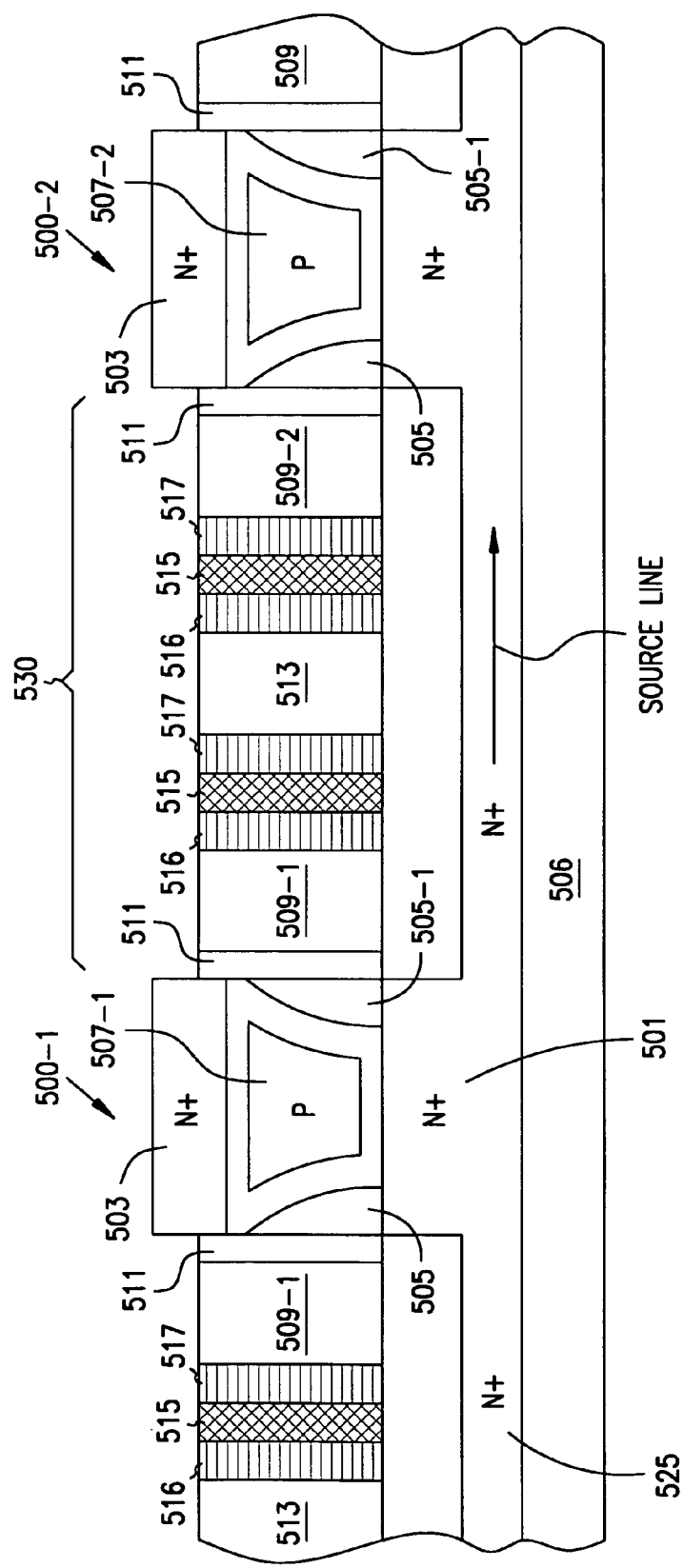
FIGS. 5A–5E are cross sectional views taken along cut line 5—5 from FIG. 4 illustrating a number of floating gate and control gate configurations which are included in the scope of the present invention.

FIGS. 5A–5E are cross sectional views taken along cut line 5—5 from FIG. 4. As mentioned above in connection with FIG. 3, a number of floating gate and control gate configurations are included in the present invention. FIG. 5A illustrates one such embodiment of the present invention. FIG. 5A illustrates a first source/drain region 501 and second source/drain region 503 for a non-volatile memory cell 500 formed according to the teachings of the present invention. As shown in FIG. 5, the first and second source/drain regions, 501 and 503, are contained in a pillar of semiconductor material, and separated by a body region 507 including channel regions 505. As shown in the embodiments of FIGS. 5A–5E, the first source/drain region 501 is integrally connected to a buried sourceline 525. As one or ordinary skill in the art will understand upon reading this disclosure the buried sourceline 525 is be formed of semiconductor material which has the same doping type as the first source/drain region 501. In one embodiment, the sourceline 525 is formed of semiconductor material of the same doping as the first source/drain region 501, but is more heavily doped than the first source/drain region 501.

As shown in the embodiment of FIG. 5A, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In this embodiment, a single control gate 513 is shared by the pair of floating gates 509-1 and 509-2 on opposing sides of the trench 530. As one of ordinary skill in the art will understand upon reading this disclosure, the shared single control gate 513 can include an integrally formed control gate line. As shown in FIG. 5A, such an integrally formed control gate line 513 can be one of a plurality of control gate lines which are each independently formed in the trench, such as trench 530, below the top surface of the pillars 500-1 and 500-2 and between the pair of floating gates 509-1 and 509-2. In one embodiment, according to the teachings of the present invention, each floating gate, e.g. 509-1 and 509-2, includes a vertically oriented floating gate having a vertical length of less than 100 nanometers.

Figure 5B:
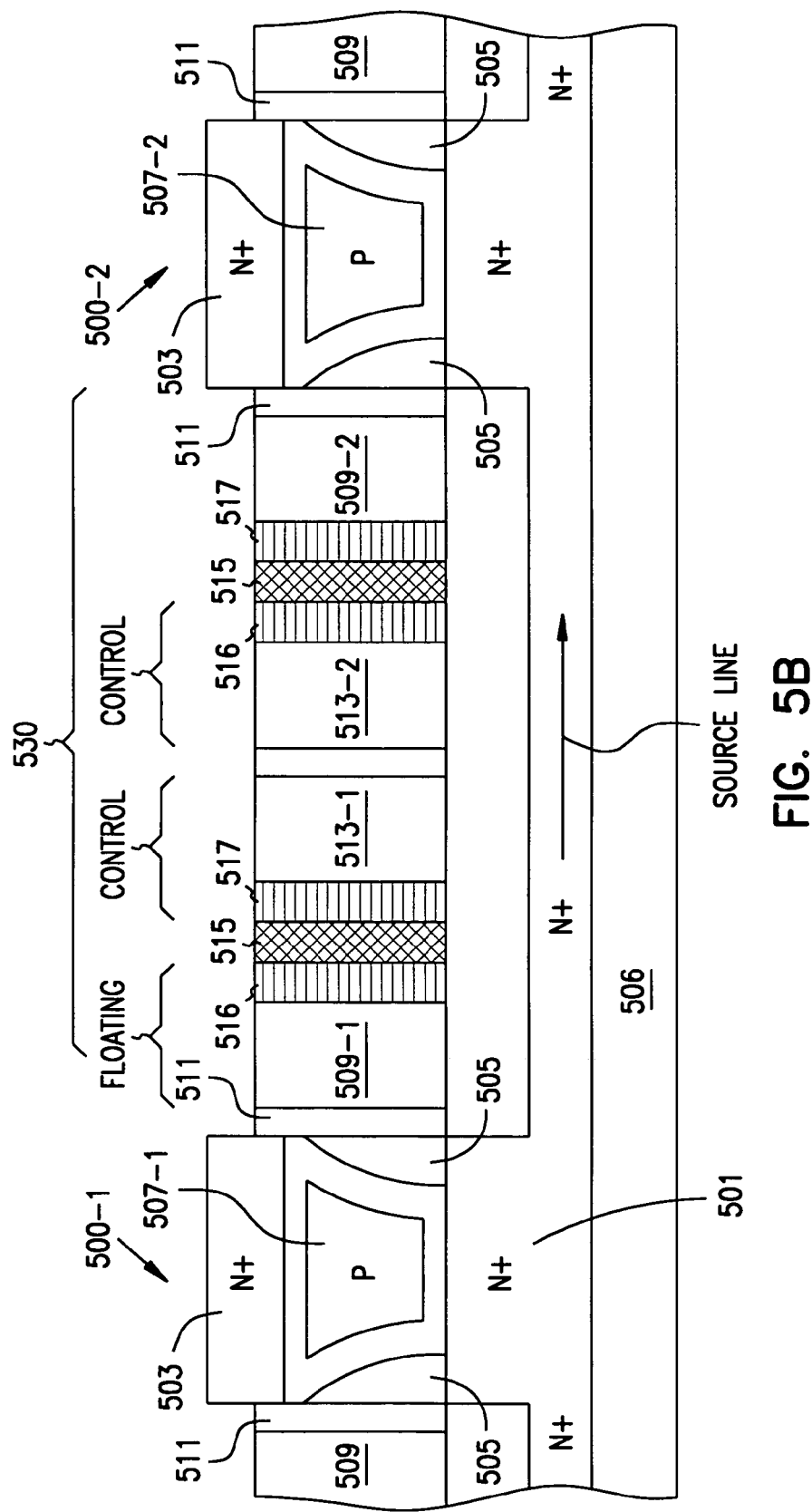

As shown in the embodiment of FIG. 5B, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5B, a plurality of control gate lines are again formed in trenches, e.g. trench 530, below the top surface of the pillars, 500-1 and 500-2, and between the pair of floating gates 509-1 and 509-2. However, in this embodiment, each trench, e.g. 530, houses a pair of control gate lines, shown as 513-1 and 513-2. Each one of the pair of control gate lines 513-1 and 513-2 addresses the floating gates, 509-1 and 509-2 respectively, on opposing sides of the trench 530. In this embodiment, the pair of control gate lines, or control gates 513-1 and 513-2 are separated by an insulator layer.

Figure 5C:
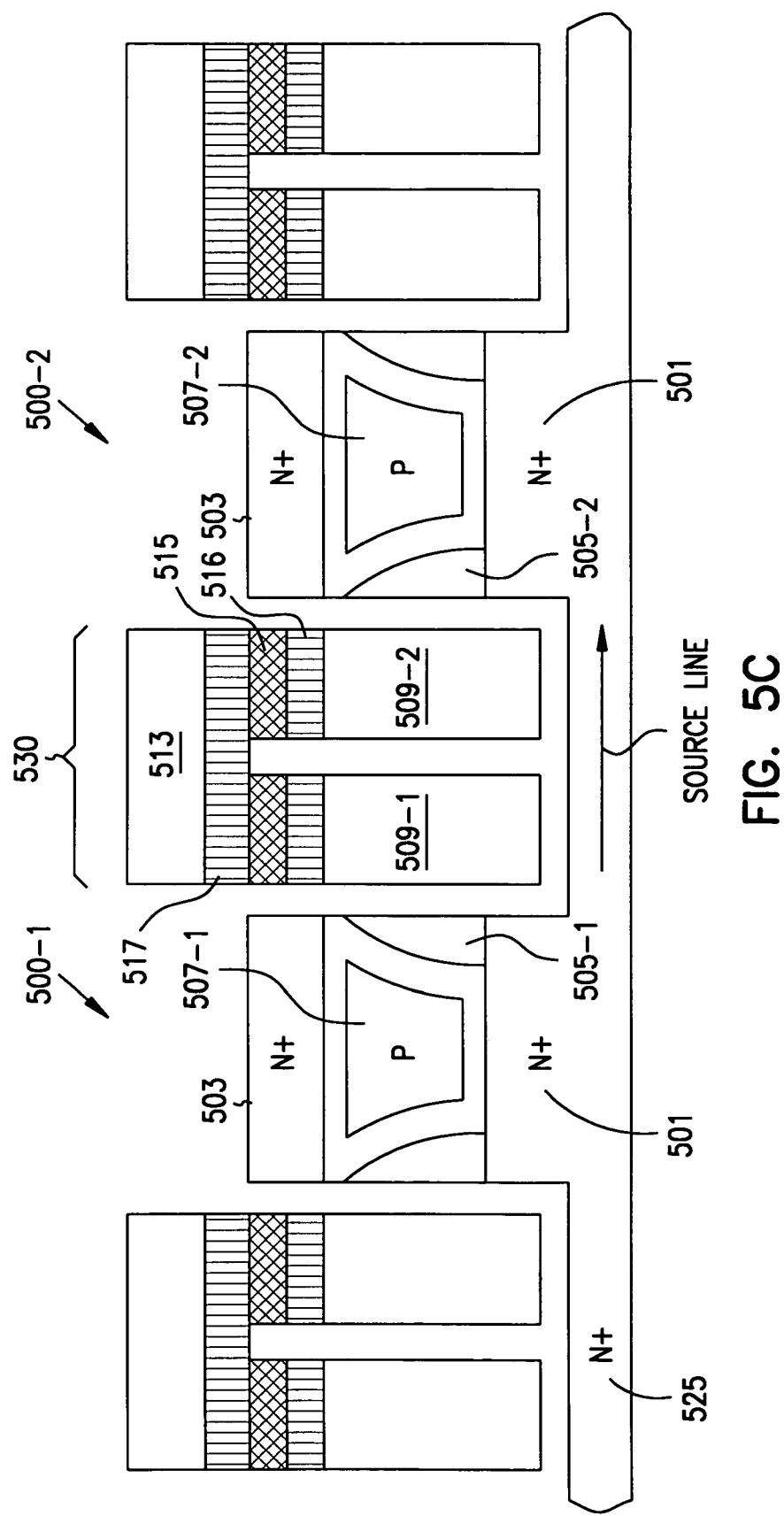

As shown in the embodiment of FIG. 5C, a pair of floating gates 509-1 and 509-2 are again formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5C, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. In the embodiment of FIG. 5C, each pair of floating gates, e.g. 509-1 and 509-2, in a given trench shares a single control gate line, or control gate 513.

Figure 5D:
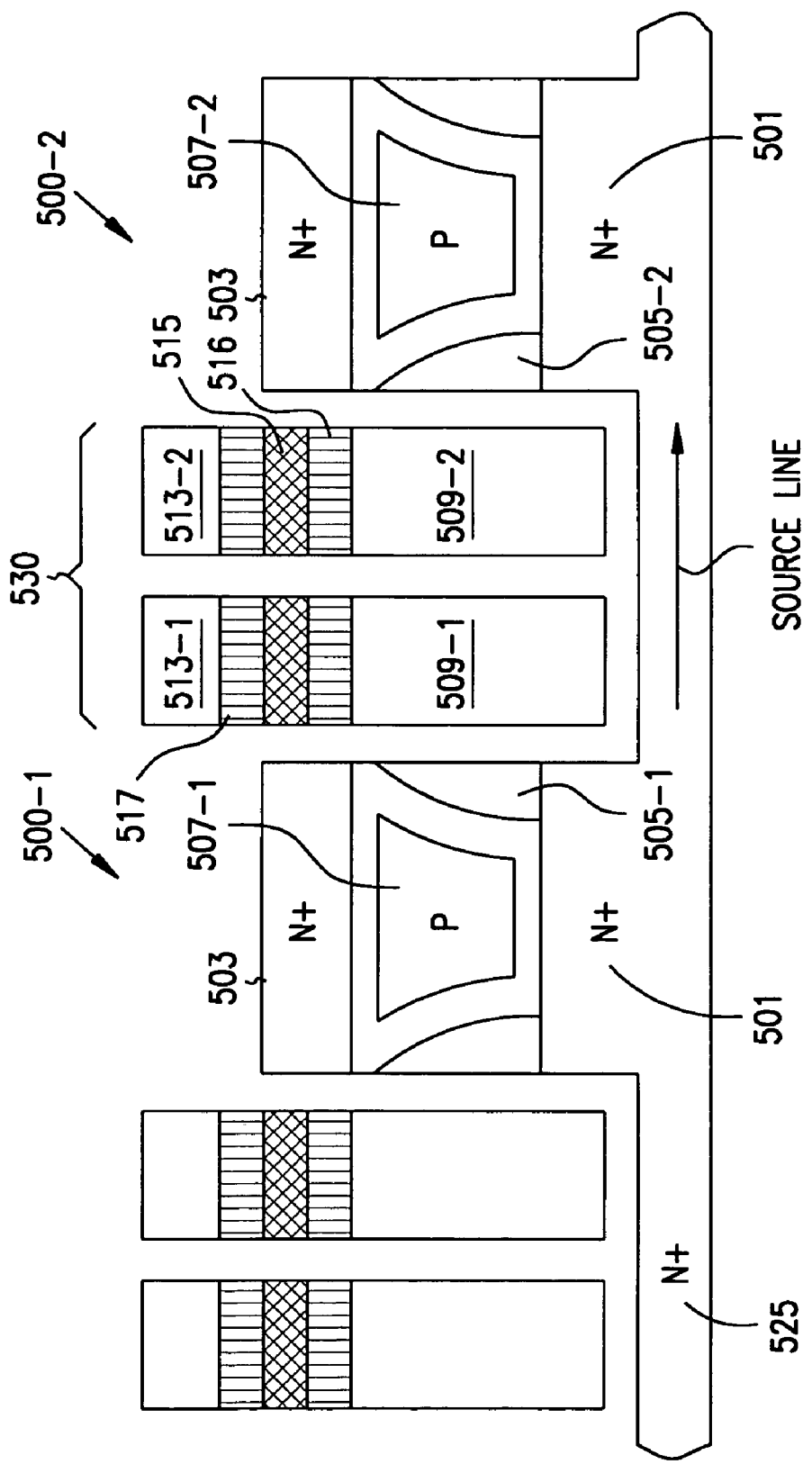

As shown in the embodiment of FIG. 5D, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5D, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. However, in the embodiment of FIG. 5D, each one of the pair of floating gates, e.g. 509-1 and 509-2, is addressed by an independent one of the plurality of control lines or control gates, shown in FIG. 5D as 513-1 and 513-2.

Figure 5E:
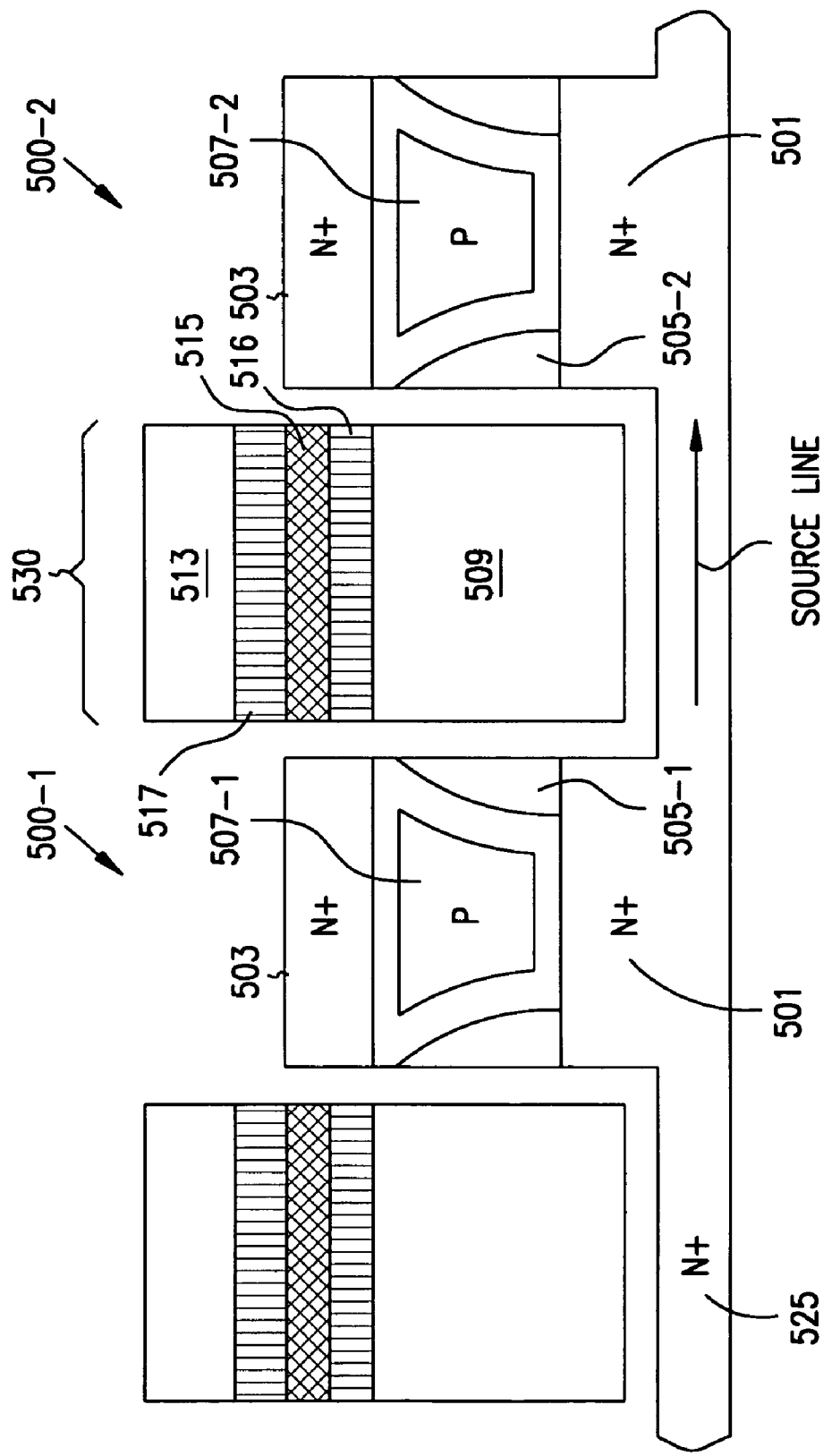

As shown in the embodiment of FIG. 5E, a single floating gate 509 is formed in each trench 530 between adjacent pillars which form memory cells 500-1 and 500-2. According to the teachings of the present invention, the single floating gate 509 can be either a vertically oriented floating gate 509 or a horizontally oriented floating gate 509 formed by conventional processing techniques, or can be a horizontally oriented floating gate 509 formed by a replacement gate technique such as described in a copending application, entitled "Flash Memory with Ultrathin Vertical Body Transistors," by Leonard Forbes and Kie Y. Ahn, application Ser. No. 09/780, 169. In one embodiment of the present invention, the floating gate 509 has a vertical length facing the body region 505 of less than 100 nm. In another embodiment, the floating gate 509 has a vertical length facing the body region 505 of less than 50 nm. In one embodiment, as shown in FIG. 5E, the floating gate 509 is shared, respectively, with the body regions 507-1 and 507-2, including channel regions 505-1 and 505-2, in adjacent pillars 500-1 and 500-2 located on opposing sides of the trench 530. In one embodiment, the control gate 513 includes a horizontally oriented control gate 513 formed above the horizontally oriented floating gate 509.

As one of ordinary skill in the art will understand upon reading this disclosure, in each of the embodiments described above in connection with FIGS. 5A–5E the floating gates 509 are separated from the control gate lines, or control gates 513 with an asymmetrical low tunnel barrier intergate insulator in accordance with the descriptions given above in connection with FIG. 3. The modifications here are to use tunneling through the interpoly dielectric to realize flash memory devices. The vertical devices include an extra flexibility in that the capacitors, e.g. gate oxide and intergate insulator, are easily fabricated with different areas. This readily allows the use of very high dielectric constant inter-poly dielectric insulators with lower tunneling barriers.

Figure 6A:
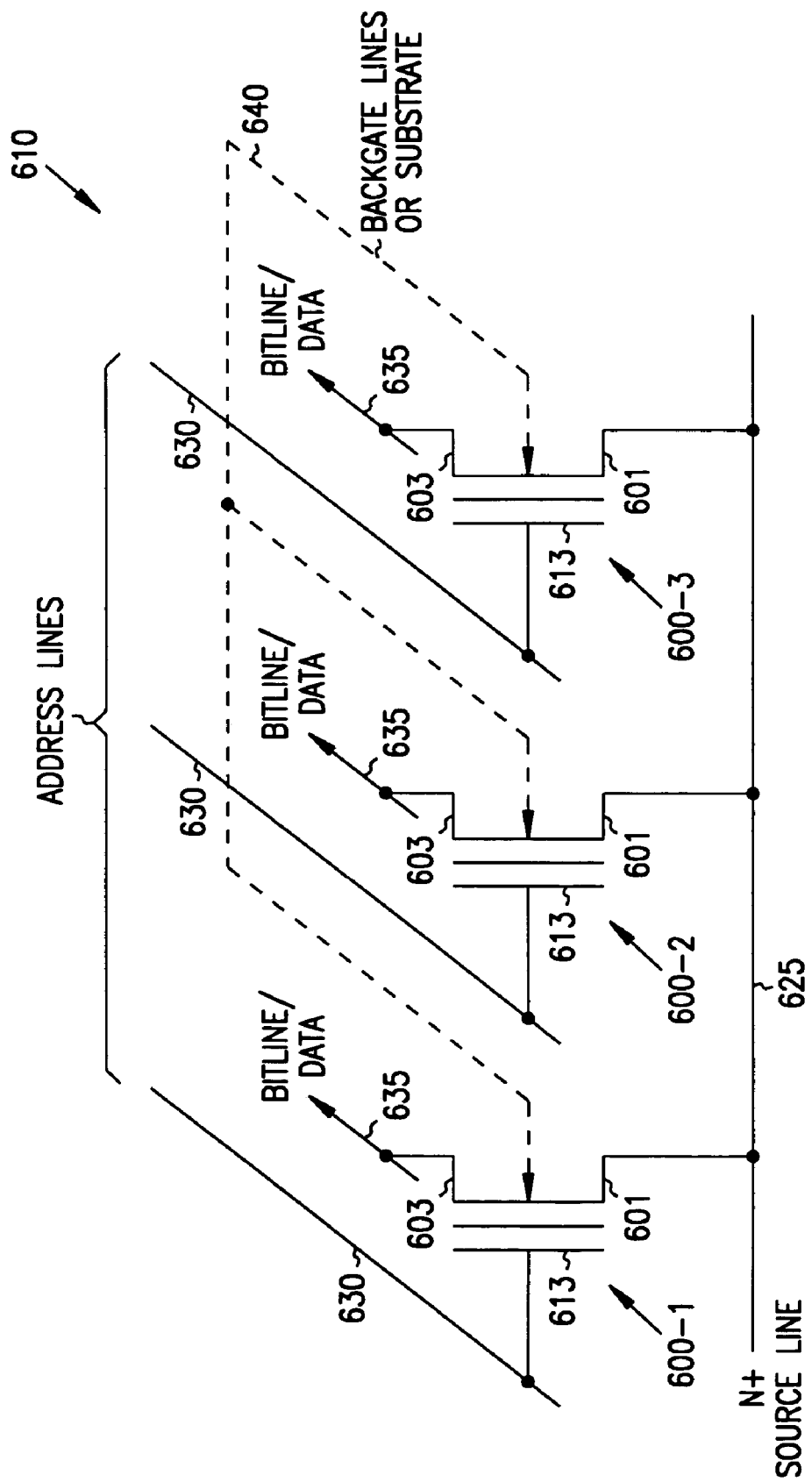
FIGS. 6A–6D illustrate a number of address coincidence schemes can be used together with the present invention.

FIGS. 6A–6D illustrate that a number of address coincidence schemes can be used together with the present invention. FIG. 6A illustrates a NOR flash memory array 610 having a number of non-volatile memory cells 600-1, 600-2, 600-3, using a coincidence address array scheme. For purposes of illustration, FIG. 6A shows a sourceline 625 coupled to a first source/drain region 601 in each of the number of non-volatile memory cells 600-1, 600-2, 600-3. The sourceline is shown oriented in a first selected direction in the flash memory array 610. In FIG. 6A, a number of control gate lines 630 are shown oriented in a second selected direction in the flash memory array 610. As shown in FIG. 6A, the number of control gate lines 630 are coupled to, or integrally formed with the control gates 613 for the number of non-volatile memory cells 600-1, 600-2, 600-3. As shown in FIG. 6A, the second selected direction is orthogonal to the first selected direction. Finally, FIG. 6A shows a number of bitlines 635 oriented in a third selected direction in the flash memory array 610. As shown in FIG. 6A, the number of bitlines are coupled to the second source/drain regions in the number of non-volatile memory cells 600-1, 600-2, 600-3. In the embodiment shown in FIG. 6A the third selected direction is parallel to the second selected direction and the number of control gate lines 630 serve as address lines. Also, as shown in FIG. 6A, the flash memory array 610 includes a number of backgate or substrate/well bias address lines 640 coupled to the substrate.

Figure 6B:
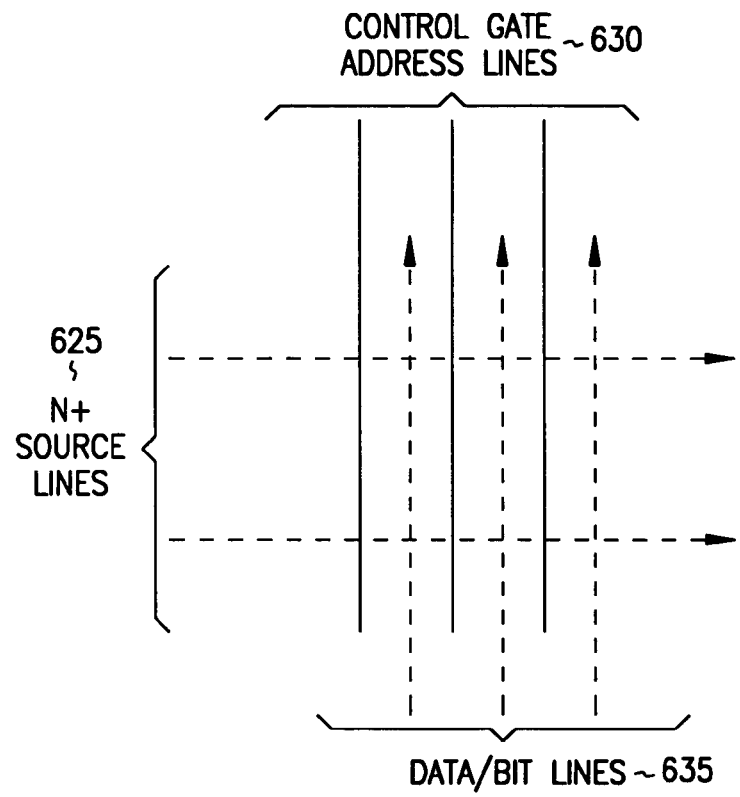
Figure 6C:
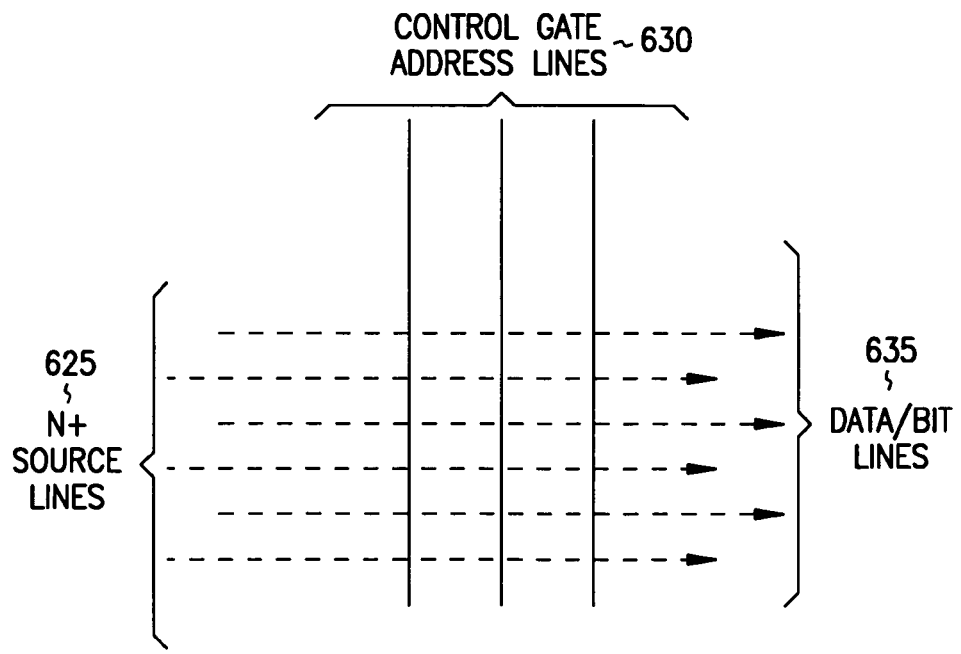
Figure 6D:
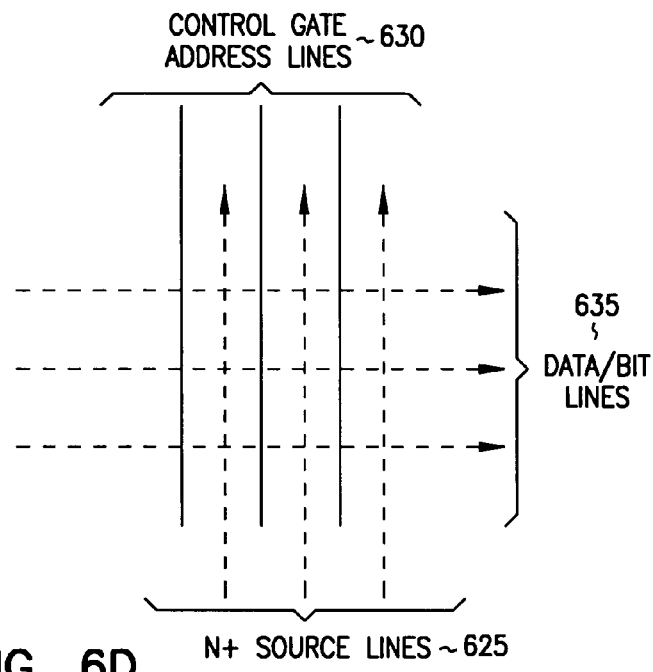

Using FIG. 6A as a reference point, FIGS. 6B–6D illustrate of top view for three different coincidence address scheme layouts suitable for use with the present invention. First, FIG. 6B provides the top view layout of the coincidence address scheme described in connection with FIG. 6A. That is, FIG. 6B illustrates a number of sourcelines 625 oriented in a first selected direction, a number of control gate lines 630 oriented in a second selected direction, and a number of bitlines 635 oriented in a third selected direction for the flash memory array 600. As explained above in connection with FIG. 6A, in this embodiment, the second and third selected direction are parallel to one another and orthogonal to the first selected direction such that the number of control gate lines 630 serve as address lines.

FIG. 6C provides the top view layout of another coincidence address scheme according to the teachings of the present invention. This is, FIG. 6C illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6C, the first selected direction and the third selected direction are parallel to one another and orthogonal to the second selected direction. In this embodiment, the number of control gate lines 630 again serve as address lines.

FIG. 6D provides the top view layout of yet another coincidence address scheme according to the teachings of the present invention. This is, FIG. 6D illustrates a number of sourcelines 625 oriented in a first selected direction, a number of control gate lines 630 oriented in a second selected direction, and a number of bitlines 635 oriented in a third selected direction for the flash memory array 600. In the embodiment of FIG. 6D, the first selected direction and the second selected direction are parallel to one another and orthogonal to the third selected direction. In this embodiment, the number of bitlines 635 serve as address lines.

As will be apparent to one of ordinary skill in the art upon reading this disclosure, and as will be described in more detail below, write can still be achieved by hot electron injection and/or, according to the teachings of the present invention, tunneling from the control gate to the floating gate. According to the teachings of the present invention, block erase is accomplished by driving the control gates with a relatively large positive voltage and tunneling from the metal on top of the floating gate to the metal on the bottom of the control gate.

Figure 7A:
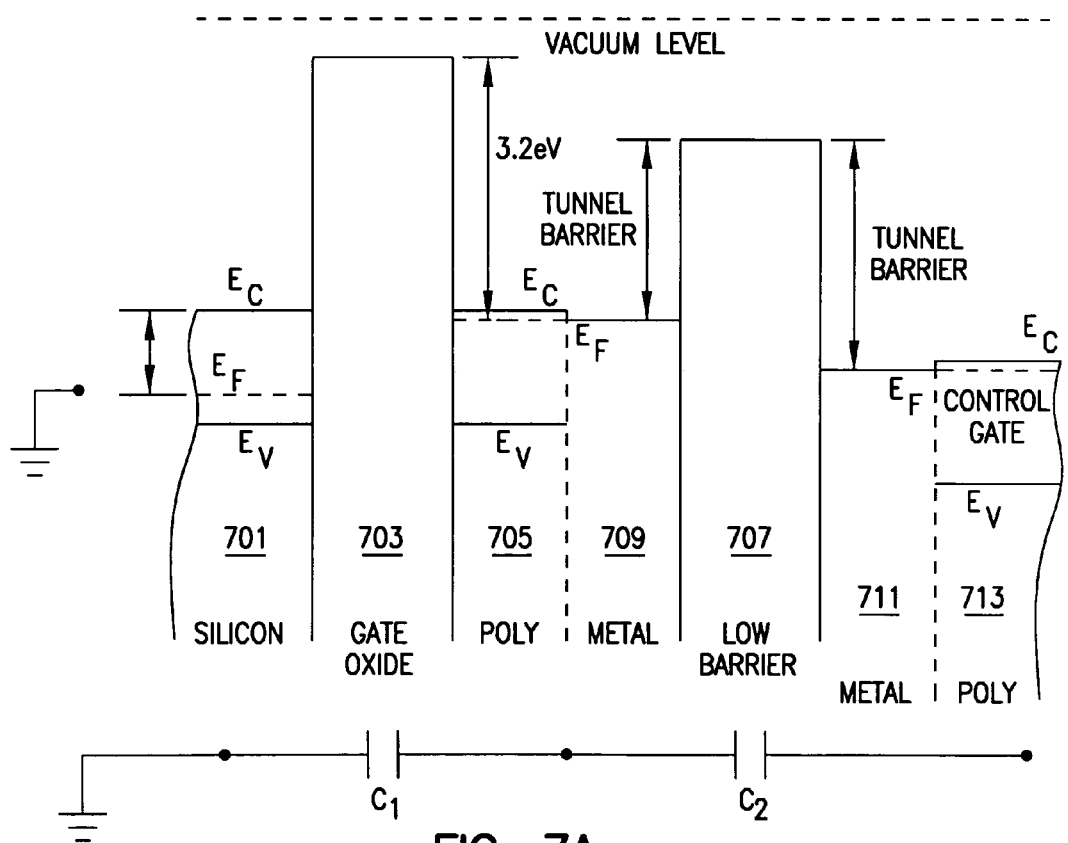
FIG. 7A is an energy band diagram illustrating the band structure at vacuum level with the low tunnel barrier interpoly insulator according to the teachings of the present invention.

FIG. 7A is an energy band diagram illustrating the band structure at vacuum level with the asymmetrical low tunnel barrier interpoly insulator according to the teachings of the present invention. FIG. 7A is useful in illustrating the reduced tunnel barrier off of the floating gate to the control gate and for illustrating the respective capacitances of the structure according to the teachings of the present invention.

FIG. 7A shows the band structure of the silicon substrate, e.g. channel region 701, silicon dioxide gate insulator, e.g. gate oxide 703, polysilicon floating gate 705, the asymmetrical low tunnel barrier interpoly dielectric 707, between metal plates 709 and 711, and then the polysilicon control gate 713, according to the teachings of the present invention.

The design considerations involved are determined by the dielectric constant, thickness and tunneling barrier height of the asymmetrical interpoly dielectric insulator 707 relative to that of the silicon dioxide gate insulator, e.g. gate oxide 703. The tunneling probability through the interpoly dielectric 707 is an exponential function of both the barrier height and the electric field across this dielectric.

FIG. 7A shows the asymmetrical tunnel barriers, formed by atomic layer deposition (ALD), used for easy erase. Erase is achieved by the use of positive control gate voltages through the low tunnel barrier. In one embodiment, according to the teachings of the present invention, read utilizes positive control gate voltages with n-channel enhancement mode devices as described in the above referenced, copending applications, by the same inventors, entitled "FLASH MEMORY DEVICES WITH METAL OXIDE AND/OR LOW TUNNEL BARRIER INTERPLOY INSULATORS," application Ser. No. 09/945,507, "PROGRAMMABLE MEMORY ADDRESS AND DECODE DEVICES WITH METAL OXIDE AND/OR LOW TUNNEL BARRIER INTERPLOY INSULATORS," application Ser. No. 09/945,500, "FIELD PROGRAMMABLE LOGIC ARRAYS WITH METAL OXIDE AND/OR LOW TUNNEL BARRIER INTERPLOY INSULATORS," application Ser. No. 09/945,512, "DEAPROM WITH INSULATING METAL OXIDE INTERPLOY INSULATORS," application Ser. No. 09/945,498. In another embodiment, according to the teachings of the present invention, read utilizes negative control gate voltages with n-channel depletion mode devices as described in the above referenced, copending application, by the same inventors, entitled "PROGRAMMABLE ARRAY TYPE LOGIC AND/OR MEMORY DEVICES WITH METAL OXIDE AND/OR LOW ASYMMETRICAL TUNNEL BARRIER INTERPLOY INSULATORS," application Ser. No. 09/943,134. In another embodiment, according to the teachings of the present invention, read utilizes negative control gate voltages with p-channel enhancement mode devices as described in the above referenced, copending application, by the same inventors, entitled "PROGRAMMABLE ARRAY TYPE LOGIC OR MEMORY WITH P-CHANNEL DEVICES AND ASYMMETRICAL TUNNEL BARRIERS," application Ser. No. 10/028,001. Programming is accomplished by channel hot electron injection with n-channel devices and/or electron injection from the control gate for both n-channel and p-channel devices and may or may not utilize positive substrate, well, or body bias.

Figure 7B:
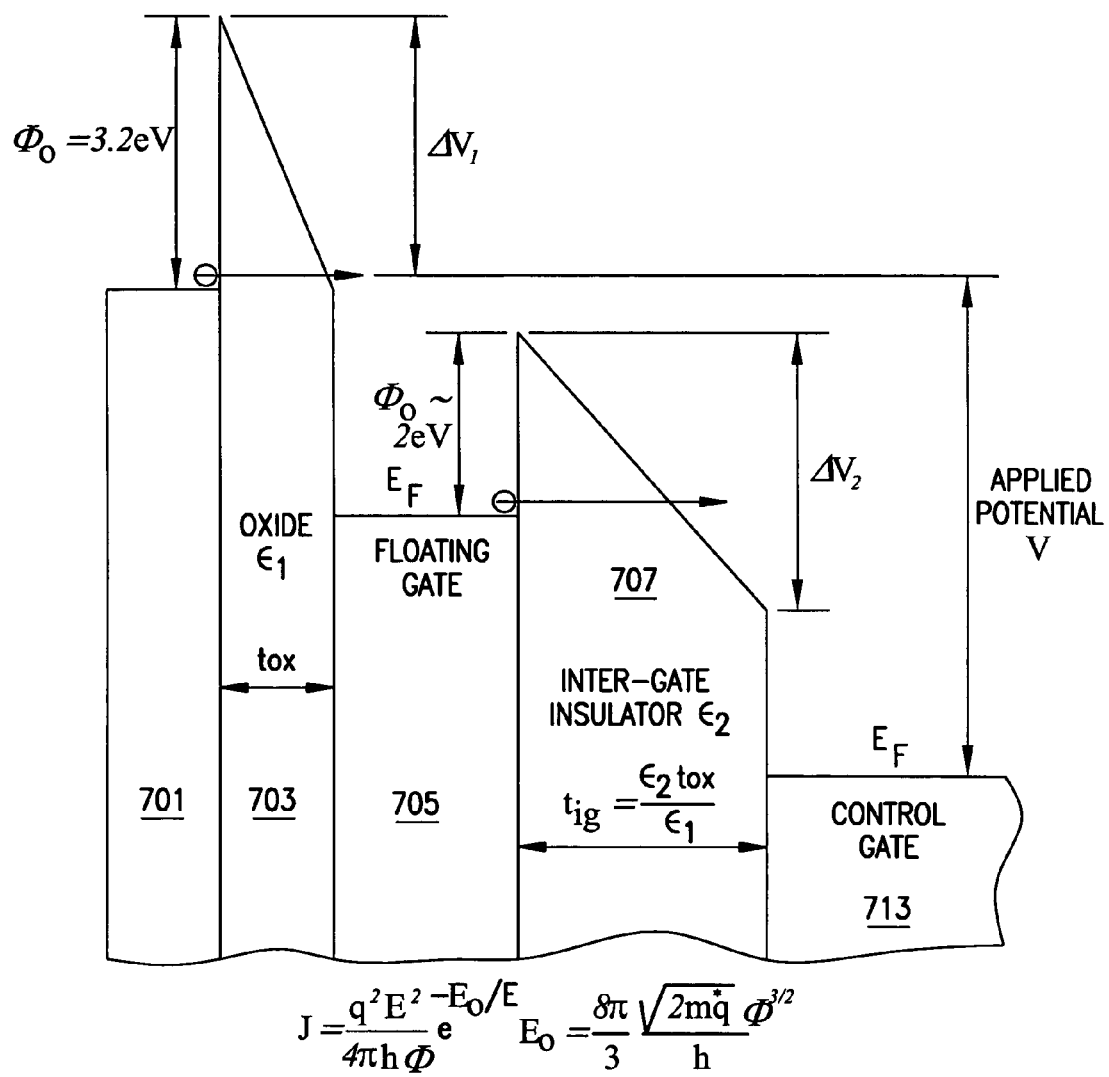
FIG. 7B is an energy band diagram illustrating the band structure during an erase operation of electrons from the floating gate to the control gate across the low tunnel barrier interpoly insulator according to the teachings of the present invention.

FIG. 7B is an energy band diagram illustrating the band structure during an erase operation of electrons from the floating gate 705 to the control gate 713 across the low tunnel barrier interpoly insulator 707 according to the teachings of the present invention. FIG. 7B is similarly useful in illustrating the reduced tunnel barrier off of the floating gate 705 to the control gate 713 and for illustrating the respective capacitances of the structure according to the teachings of the present invention.

As shown in FIG. 7B, the electric field is determined by the total voltage difference across the structure, the ratio of the capacitances (see FIG. 7A), and the thickness of the asymmetrical interpoly dielectric 707. The voltage across the asymmetrical interpoly dielectric 707 will be, $\Delta V2=VC1/(C1+C2)$, where V is the total applied voltage. The capacitances, C, of the structures depends on the dielectric constant, $\in_r$, the permittivity of free space, $\in_o$, and the thickness of the insulating layers, t, and area, A, such that $C=\in_r \in_o A/t$, Farads/cm$^2$, where $\in_r$ is the low frequency dielectric constant. The electric field across the asymmetrical interpoly dielectric insulator 707, having capacitance, C2, will then be $E2=\Delta V2/t2$, where t2 is the thickness of this layer.

The tunneling current in erasing charge from the floating gate 705 by tunneling to the control gate 713 will then be as shown in FIG. 7B given by an equation of the form:

$$J=B \exp(-Eo/E)$$

where E is the electric field across the interpoly dielectric insulator 707 and Eo depends on the barrier height. Practical values of current densities for aluminum oxide which has a current density of 1 A/cm$^2$ at a field of about $E=1V/20 Å=5\times 10^{+6}$ V/cm are evidenced in a description by Pollack. (See generally, S. R. Pollack and C. E. Morris, "Tunneling through gaseous oxidized films of Al$_2$O$_3$," Trans. AIME, Vol. 233, p. 497, 1965). Practical current densities for silicon oxide transistor gate insulators which has a current density of 1 A/cm$^2$ at a field of about $E=2.3V/23 Å=1\times10^{+7}$ V/cm are evidenced in a description by T. P. Ma et al. (See generally, T. P. Ma et al., "Tunneling leakage current in ultrathin (<4 nm) nitride/oxide stack dielectrics," IEEE Electron Device Letters, vol. 19, no. 10, pp. 388–390, 1998).

The lower electric field in the aluminum oxide interpoly insulator 707 for the same current density reflects the lower tunneling barrier of approximately 2 eV, shown in FIG. 7B, as opposed to the 3.2 eV tunneling barrier of silicon oxide 703, also illustrated in FIG. 7B.

Figure 7C:
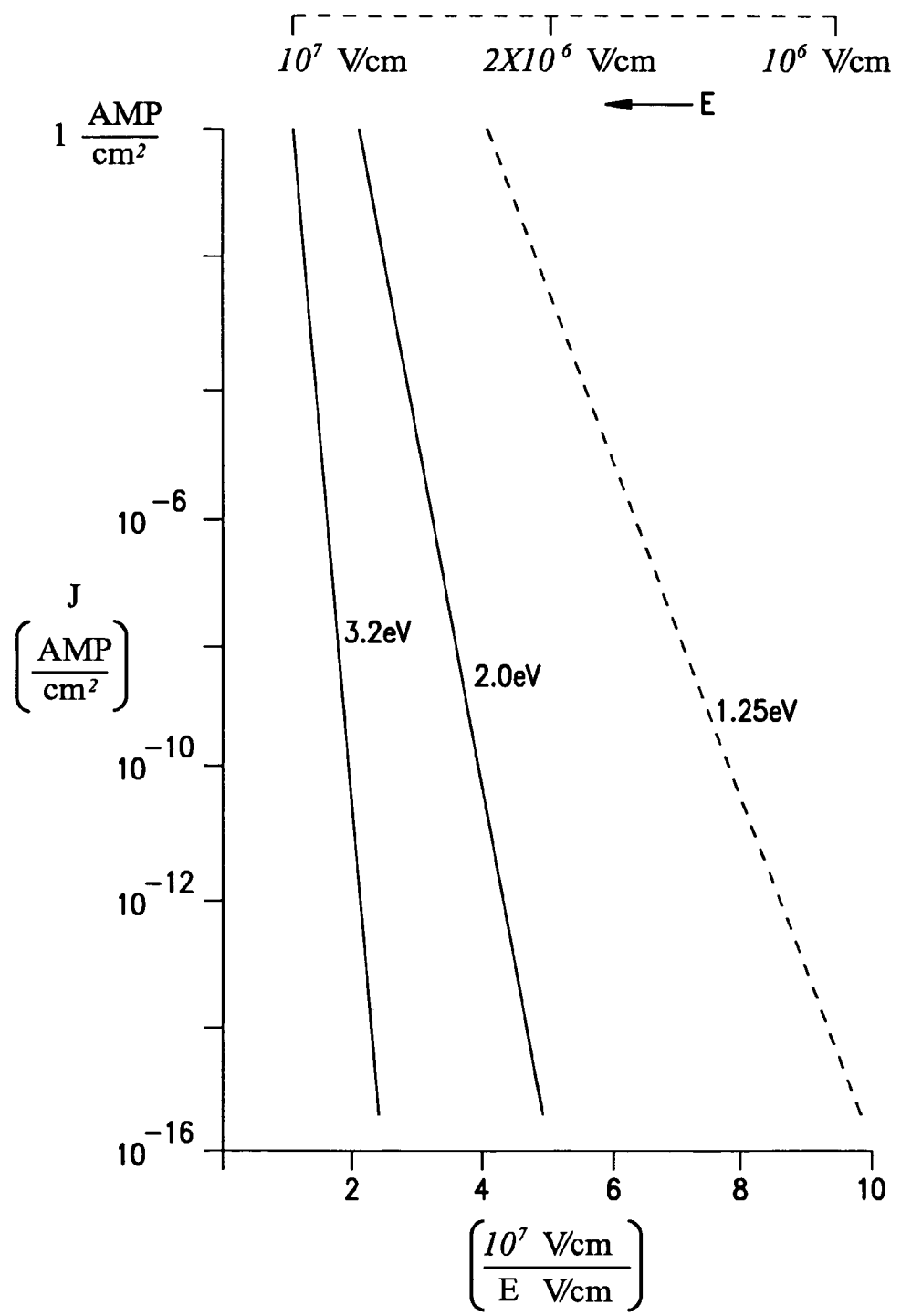
FIG. 7C is a graph plotting tunneling currents versus the applied electric fields (reciprocal applied electric field shown) for an number of barrier heights.

FIG. 7C is a graph plotting tunneling currents versus the applied electric fields (reciprocal applied electric field shown) for a number of barrier heights. FIG. 7C illustrates the dependence of the tunneling currents on electric field (reciprocal applied electric field) and barrier height. The fraction of voltage across the asymmetrical interpoly or asymmetrical intergate insulator, $\alpha V2$, can be increased by making the area of the intergate capacitor, C2, (e.g. intergate insulator 707) smaller than the area of the transistor gate capacitor, C1 (e.g. gate oxide 703). This would be required with high dielectric constant intergate dielectric insulators 707 and is easily realized with the vertical floating gate structures described above in connection with FIGS. 3, and 5A–5E.

Methods of Formation

As described above, this disclosure describes the use of asymmetrical tunnel barriers formed by atomic layer deposition (ALD) and specifically low tunnel barriers during erase, to make erase of flash memory type devices easier. In conventional flash memory type devices with tunnel erase from the floating gate to the transistor source, the silicon oxide presents a very high 3.2 eV barrier and high electric fields are required. The combination of very high electric fields and damage by hot electron collisions in the oxide result in a number of operational problems like soft erase error, reliability problems of premature oxide breakdown and a limited number of cycles of write and erase. The tunneling currents depend exponentially on the barrier heights. An asymmetrical barrier, as shown in FIG. 7A, presents a low barrier for erase but can present a higher barrier during read and/or write operations when tunneling is not desired. These asymmetrical barriers can be achieved various ways, one technique is to use different metal contact plates, with the upper plate on the interpoly or intergate insulator being a metal like platinum with a large work function as described above in the referenced, copending application, by the same inventors, entitled "PROGRAMMABLE ARRAY LOGIC OR MEMORY DEVICES WITH ASYMMETRICAL TUNNEL BARRIERS," application Ser. No. 09/943,134.

Key characteristics of ultra-thin ALD oxides for this invention include the following:

(a) Films can be grown at low (<300 to 400 degrees Celsius) temperatures.

(b) Films can be grown on a variety of substrate materials, including a wide range of inorganic (e.g., silicon, glass, oxide and nitride) to metallic surfaces.

(c) Films can be comprised of single (e.g., Al$_2$O$_3$) and multiple metal components.

(d) The thicknesses of the oxide films can be controlled to within a thickness of 1 monolayer. Their thickness uniformities are exceptionally high.

(e) Films are chemically homogeneous, uniform and have a strong tendency to form the most stable compositions in their respective metal-oxygen systems. For example, Ta$_2$O$_5$ forms in the Ta—O system.

(f) Even ultra-thin films exhibit excellent step and sidewall coverage. This will be particularly advantageous for enhancing the quality of so-called "vertical transistor" devices. Step coverage difficulties are relatively less demanding in "horizontally configured" transistors.

(g) Control of the bottom metal layer thickness and uniformity are less demanding, provided the metal is sufficiently conductive throughout. In other words, the prime function of the metal, in combination with the appropriate oxide, is to produce a lower tunnel barrier relative to conventional barriers such as Si/SiO$_2$.

(h) Films are excellent insulators with high breakdown strengths.

(i) Films have high dielectric constants as formed at low temperatures. This invention does not require that the oxides have very high dielectric constants. However, if necessary, many of the ALD oxides can be subsequently heat treated to substantially increase their dielectric constants. Such changes typically result from minute microstructural changes, i.e., transformations from amorphous to nano-crystalline phases.

As is well-known to those in the field, the literature describing ALD oxide processes is quite large and still expanding rapidly. Within reasonable constraints imposed by chemical and physical properties of component metals and their oxides, ALD processes can be developed for producing an even wider range of single and multi-component oxide thin films. A few examples of ALD processes for forming some useful oxides for tunnel barriers and other applications are given next.

Al$_2$O$_3$ Films. A variety of ALD processes have been described for making high quality, ultra-thin Al$_2$O$_3$ films. Thus Kim et al. (see generally, Y. K. Kim et al., "Novel capacitor technology for high density, stand-alone and embedded DRAMs", IEDM (2000)) describe the use of TMA and ozone to form superior $Al_2O_3$ films on silicon at 350 C for DRAM applications. J. H. Lee et al. (see generally, J. H. Lee, et al., "Effect of polysilicon gate on the flatband voltage shift and mobility degradation for ALD-$Al_2O_3$ gate dielectric", IEDM (2000); D-G Park et al., "Characteristics of $n^+$ polycrystalline-Si/$Al_2O_3$/Si metal-oxide-semiconductor structures prepared by atomic layer chemical vapor deposition using $Al(Ch_3)_3$ and $H_2O$ vapor", Jour. Appl. Phys. 89 (11), pp. 6275–6280 (2001)) from the same laboratory investigated the effects of doped poly-silicon gate electrode layers on the properties of $Al_2O_3$ films formed by ALD at 450 degrees Celsius and crystallized at 850 degrees Celsius and found that interfacial dopant segregation can improve capacitive characteristics. In quite a different application, Paranjpe et al. (see generally, A. Paranjpe et al., "Atomic layer deposition of $AlO_x$ for thin film head gap applications", Jour. Electrochem. Soc. 148 (9), G465–G471 (2001)) developed an ALD process (using TMA to form Al precursor layers and oxidizing them with water) to produce excellent $AlO_x$ layers at 150–200 degrees Celsius for use in advanced gap and tunnel junction devices. Alumina films, grown on substrates as diverse as Si, Ta and NiFe were amorphous, conformal, stoichiometric (to within 2 at. %), pure (<5 at. % hydrogen and <1 at. % other impurities), smooth ($R_A$~2 angstroms) with controllable levels of stress. Extraordinary levels of thickness control (to within 1 angstrom) have been achieved upon using ALD to form ultra-thin $Al_2O_3$ and $SiO_2$ films on BN particles. Such oxide coatings can be employed to modify surface energies in order to increase loading of BN particles in polymer films for packaging. (See generally, J. D. Ferguson et al., "Atomic layer deposition of $Al_2O_3$ and $SiO_2$ on BN particles using sequential surface reactions", Appl. Surf. Sci. 162–163, pp. 280–292 (2000)).

Transition Metal (TM) Oxide Films. Various ALD processes have also been described for producing ultra-thin $Ta_2O_5$ films. Kim et al. (see generally, Y. S. Kim et al., "Effect of rapid thermal annealing on the structure and the electrical properties of atomic layer deposited $Ta_2O_5$ films", Jour. Korean Phys. Soc. 37 (6), pp. 975–979 (2000)) have grown such oxide films on Si wafers and ITO glasses at 300 degrees Celsius by reacting $Ta(OEt)_5$ and water. Films made under 550 degrees Celsius were amorphous. Their dielectric constant increased with RTA temperature. With increasing RTA temperatures, leakage initially became smaller and then increased as crystallization became more evident. Such effects are known to depend upon RTA ambients and $Ta_2O_5$ underlayers and must be optimized according to applications to produce useful tunnel barriers.

Smith et al. (see generally, R. C. Smith et al., "Chemical vapour deposition of the oxides of titanium, zirconium and hafnium for use as high-k materials in microelectronic devices. A carbon-free precursor for the synthesis of hafnium dioxide", Advanced Materials for Optics and Electronics, 10, pp. 105–114 (2001)) surveyed Group IV metal precursors used for the formation of thin $TiO_2$, $ZrO_2$ and $HfO_2$ films by both CVD and ALCVD processes in an effort to produce oxides that are completely carbon-, hydrogen- and halogen-free. They found, for example, that $Hf(NO_3)_4$ could be used for making CVD $HfO_2$ films on silicon at temperatures as low as 300 degrees Celsius. Such films contain excess oxygen and that can apparently be removed by heating in nitrogen at higher temperatures. Similar findings were made forming $TiO_2$ and $ZrO_2$ films. The authors opine that these oxides could be made by ALCVD, using Group IV nitrate precursors. Due to the low ALD operable temperatures, it is possible to conduct detailed in situ deposition rate studies in many instances in order to more precisely define metal oxide thicknesses. For example, Aarik et al. (see generally, J. Aarik et al, "Anomalous effect of temperature on atomic layer deposition of titanium dioxide", Jour. Crystal Growth 220, pp. 531–537 (2000). See also K. Kukli et al., "Real time monitoring in atomic layer deposition of $TiO_2$ from $TiI_4$ and $H_2O$—$H_2O_2$", Langmuir 16, pp. 8122–8128 (2000)) used a $TiCl_4$+$H_2O$ ALD process to grow $TiO_2$ films on quartz QCM substrates: deposition rate, refractive index and related properties were highly dependent on deposition temperature in the 150 to 225 degrees Celsius range. This unexpected high dependency resulted from unusual surface roughening due to the simultaneous formation of amorphous and crystalline $TiO_2$ phase at the higher temperatures. Other crystalline $TiO_2$ phases can co-deposit at the ALD temperatures are raised to 300 to 400 degrees Celsius. Arrik et al. (see generally, J. Aarik et al., "Texture development in nanocrystalline hafnium dioxide thin films grown by atomic layer deposition", Jour. Crystal Growth 220, pp. 105–113 (2000)) have also investigated a broader range of temperature effects on $HfO_2$ formed on $SiO_2$ and Si by ALD. Using $HfCl_4$ and $H_2O$ as precursors, they found that amorphous films were formed at 225 degrees Celsius but crystalline films were formed at 300 degrees Celsius and above. Oxide films grown for microelectronic applications should desirably be amorphous in order to avoid porosity and grain boundaries causing high leakage currents (see generally, K. Kukli et al., "Atomic layer deposition of zirconium oxide from zirconium tetraiodide, water and hydrogen peroxide", Jour. Crystal Growth 231, pp. 262–272 (2001)). Zirconium dioxide films have attractively high dielectric constants but generally low breakdown values due, presumably, to their strong tendency to crystallize. The results of Kukli et al. suggest that ALD temperatures under 250 degrees Celsius should yield the desired amorphous structure when using a $ZrI_4$ precursor.

It has been shown that mixtures of transition metal oxides can also be deposited for use as tunnel barriers. Such processes involve depositing transition metal alloy precursor layers followed by oxidation, followed again by addition of the alloy precursor layer and so on until the desired mixed oxide tunnel junction thickness is reached. Likewise it has been shown that certain perovskite oxide oxide films can be formed by first using ALD to form the desired amorphous oxide composition and then heating to produce the perovskite crystal structure. Clearly formation of such mixed oxide films is more complex and will not be described here.

Process Descriptions

Two examples, according to the present invention, are sketched out below for building asymmetrical Metal/ALD Oxide/Metal tunnel barriers over poly-Si floating gate electrodes. Additional background and fabrication details are in earlier disclosures, as referenced herein, dependent on the particular ALD systems employed and is otherwise available to those skilled in the art. If patterning and other processes do not impose constraints, one could use an ALD system that is modified by the addition of a second processing chamber for depositing in situ the bottom and top metal layers. This multichamber system would provide improved control over key oxide tunnel barrier properties, especially thickness, composition and interfacial impurities.

EXAMPLE I

Figures 8, 9:
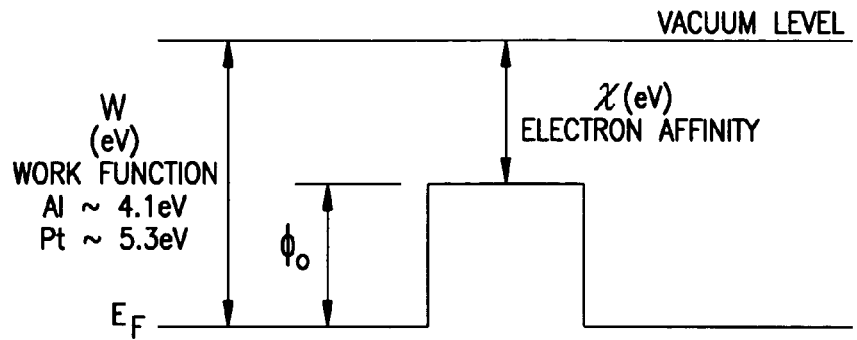
FIG. 8 illustrates a block diagram of an embodiment of an electronic system 801 according to the teachings of the present invention.
FIG. 9 is a table which provides relevant data on the barrier heights, energy gaps, dielectric constants and electron affinities of a wide variety of metal oxides that could be used as asymmetric tunnel barriers according to the teachings of the present invention.

Formation of Al/$Al_2O_3$/Al tunnel barriers can be built having a barrier height of about ~2 eV. FIG. 8 graphically illustrates the dependence of the barrier height for current injection on the work function and electron affinity of a given, homogeneous dielectric film. FIG. 9 is a table which provides relevant data on the barrier heights, energy gaps, dielectric constants and electron affinities of a wide variety of metal oxides that could be used as asymmetric tunnel barriers according to the teachings of the present invention. (See generally, H. F. Luan et al., "High quality Ta2O5 gate dielectrics with Tox equil. 10 Angstroms," IEDM Tech. Digest, pp. 141–144, 1999; J. Robertson et al., "Schottky barrier heights of tantalum oxide, barium strontium titanate, lead titanate and strontium bismuth tantalate," App. Phys. Lett., Vol. 74, No. 8, pp. 1168–1170, February 1999; J. Robertson, "Band offsets of wide-band-gap oxides and implications for future electronic devices," J. Vac. Sci. Technol. B, Vol. 18, No. 3, pp. 1785–1791, 2000; Xin Guo et al., "High quality ultra-thin (1.5 nm) TiO2/Si3N4 gate dielectric for deep submicron CMOS technology," IEDM Tech. Digest, pp. 137–140, 1999; H.-S. Kim et al., "Leakage current and electrical breakdown in metal-organic chemical vapor deposited TiO2 dielectrics on silicon substrates," Appl. Phys. Lett., Vol. 69, No. 25, pp. 3860–3862, 1996; J. Yan et al., "Structure and electrical characterization of TiO2 grown from titanium tetrakis-isoproxide (TTIP) and TTIP/H2O ambient," J. Vac. Sci. Technol. B, Vol. 14, No. 3, pp. 1706–1711, 1966).

Neglecting patterning steps along the way, the processing sequence can be:

(i) Use a low energy, inert ion plasma in the auxiliary chamber to sputter clean residual oxides, etc. from the poly-Si surfaces previously fabricated on the device wafer.

(ii) Deposit an aluminum contact layer over the poly-Si. This layer is presumably ten to hundreds of angstroms thick, as needed to insure good coverage of the poly-Si.

(iii) Transfer the device wafer to the ALD processing chamber under a vacuum sufficient to prevent inadvertent oxidation.

(iv) Produce the desired $Al_2O_3$ layer via an ALD. Several precursor chemistries are available, as indicated by the few examples in the references cited above in connection with the discussion on $Al_2O_3$. For example, the low temperature process described by Paranjpe et al. (see generally, A. Paranjpe et al., "Atomic layer deposition of $AlO_x$ for thin film head gap applications", Jour. Electrochem. Soc. 148 (9), G465–G471 (2001)) looks attractive for this purpose since it was developed to operate at temperatures in the 150–200 degrees Celsius range, using trimethylaluminum and water as precursors. As such, $Al_2O_3$ films as thin as 5 to 10 Angstroms have been shown to be continuous with excellent insulating properties.

(v) Transfer the device wafer back to the auxiliary chamber and deposit the top aluminum electrode layer.

(vi) Remove the wafer from the system for further processing, e.g., addition of silicon control layer, patterning, etc.

Barriers of $Al_2O_3$ formed on Al will exhibit some minor barrier height difference when injecting electrons from the inner and outer electrodes. The barrier height difference will be at most 0.1 eV and will arise from small differences in oxide composition at the interfaces. (See generally copending application, entitled "PROGRAMMABLE ARRAY TYPE LOGIC OR MEMORY WITH P-CHANNEL DEVICES AND ASYMMETRICAL TUNNEL BARRIERS," application Ser. No. 10/028,001, for a complete explanation). Moreover, such small differences will not interfere with the proper functioning of the devices of this disclosure.

EXAMPLE II

Formation of $Al/Ta_2O_5/Al$ tunnel barriers can be formed with a barrier height of about 2 eV. See FIGS. 8 and 9. Again, processes for producing ultra-thin films of $Ta_2O_5$ that are suitable for tunnel barriers are known. See, for example, the work of Kim et al. (see generally, Y. S. Kim et al., "Effect of rapid thermal annealing on the structure and the electrical properties of atomic layer deposited $Ta_2O_5$ films", Jour. Korean Phys. Soc. 37 (6), pp. 975–979 (2000)) cited above. Note that it may not be necessary to maximize the dielectric constant of this oxide for the present applications although such maximization is desirable for building useful, minimal area DRAM storage capacitors. One can fabricate these $Al/Ta_2O_5/Al$ tunnel barriers following the approach sketched out above.

(i) Use a low energy, inert ion plasma in the auxiliary chamber to sputter clean residual exodies, etc. from the poly-Si surfaces previously fabricated on the device wafer.

(ii) Deposit an aluminum contact layer over the poly-Si. This layer is presumably ten to hundreds of angstroms thick, as needed to insure good coverage of the poly-Si.

(iii) Transfer the device wafer to the ALD processing chamber, under a vacuum sufficient to prevent inadvertent oxidation.

(iv) Produce the desired $Ta_2O_5$ layer via an ALD process such as the one just cited, using a $Ta(OEt)_5$ and water as precursors and a temperature of 300 degrees Celsius or lower, if possible, in order to prevent inadvertent Al recrystallization and growth. Formed in this way, the dielectric constant of the oxide will be approximately 22–24.

(v) Transfer the device wafer back to the auxiliary chamber and deposit the top aluminum electrode layer.

(vi) Remove the wafer from the system for further processing, e.g., addition of silicon control layer, patterning, etc.

A very limited intermixing of Al and Ta oxides at the ALD formed interface can develop unless a few steps are taken to minimize this. For example, minimization of the ALD process temperature. Alternatively, first forming a monolayer of $Al_2O_3$ by exposing the water precursor before the $Ta(OEt)_5$ precursor. Intermixing of a monolayer or two at this interface can also be accepted (provided it is reproducible from wafer-to-wafer, run-to-run, etc.). More detailed studies have shown that the tunnel current-barrier thickness characteristics are better described in terms of an "average barrier height." Clearly the large bulk, if not all, of the tunnel barrier will consist of a layer of $Ta_2O_5$, with a thickness that could lie in the range of perhaps 20 to 50 Angstroms or more. Upon reflection of a variety of metal/oxide tunnel barriers, it is evident that "nature abhors perfect interfaces." Even in the $Si/SiO_2$ system which is perhaps the one that approaches most nearly to perfection.

System Level

Figure 10:
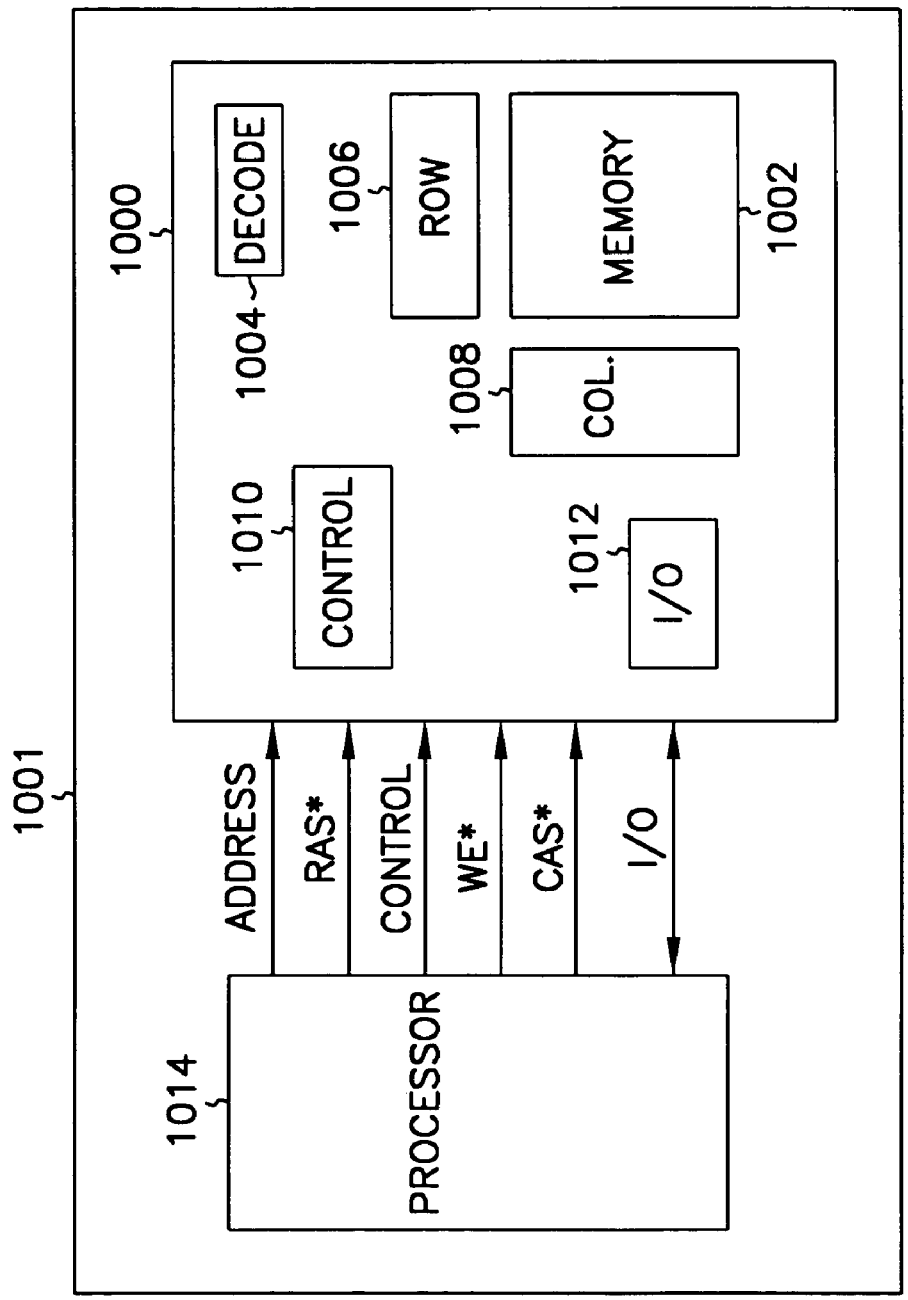
FIG. 10 illustrates a block diagram of an embodiment of an electronic system according to the teachings of the present invention.

FIG. 10 illustrates a block diagram of an embodiment of an electronic system 1001 according to the teachings of the present invention. In the embodiment shown in FIG. 10, the system 1001 includes a memory device 1000 which has an array of memory cells 1002, address decoder 1004, row access circuitry 1006, column access circuitry 1008, control circuitry 1010, and input/output circuit 1012. Also, as shown in FIG. 10, the circuit 1001 includes a processor 1014, or memory controller for memory accessing. The memory device 1000 receives control signals from the processor 1014, such as WE*, RAS* and CAS* signals over wiring or metallization lines. The memory device 1000 is used to store data which is accessed via I/O lines. It will be appreciated by those skilled in the art that additional circuitry and control signals can be provided, and that the memory device 1000 has been simplified to help focus on the invention. At least one of the processor 1014 or memory device 1000 has a memory cell formed according to the embodiments of the present invention. That is, at least one of the processor 1014 or memory device 1000 includes an asymmetrical low tunnel barrier interpoly insulator according to the teachings of the present invention.

It will be understood that the embodiment shown in FIG. 10 illustrates an embodiment for electronic system circuitry in which the novel memory cells of the present invention are used. The illustration of system 1001, as shown in FIG. 10, is intended to provide a general understanding of one application for the structure and circuitry of the present invention, and is not intended to serve as a complete description of all the elements and features of an electronic system using the novel memory cell structures. Further, the invention is equally applicable to any size and type of memory device 1000 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

CONCLUSIONS

Asymmetrical low barrier tunnel insulators are described between the floating gate and control gate in a flash memory type devices to form programmable array logic and memory devices. The asymmetrical low barrier insulators, ~2.0 eV, are formed by atomic layer deposition (ALD). While the amount of charge stored on the floating gate is small the transistor provides gain and charge multiplication resulting in a large output signal and ease of reading the stored data. If there is an adverse capacitance ratio due to a large difference of dielectric constants then the vertical gate structures described previously can be employed.

It has been shown that the asymmetrical low tunnel barrier interpoly insulators of the present invention avoid the large barriers to electron tunneling or hot electron injection presented by the silicon oxide-silicon interface, 3.2 eV, which result in slow write and erase speeds even at very high electric fields. The present invention also avoids the combination of very high electric fields and damage by hot electron collisions in the which oxide result in a number of operational problems like soft erase error, reliability problems of premature oxide breakdown and a limited number of cycles of write and erase. Further, the asymmetrical low tunnel barrier interplay dielectric insulator erase approach, of the present invention remedies the above mentioned problems of having a rough top surface on the polysilicon floating gate which results in, poor quality interpoly oxides, sharp points, localized high electric fields, premature breakdown and reliability problems.

The use of ALD greatly increases the capability of forming a given metal oxide insulator on a dissimilar metal contact layer. This ability provides a much increased latitude in independently selecting chemically and physically superior contact metals and ALD metal oxides combinations. Judicious selection of the contact metal/ALD oxide couple also provides flexibility in setting the electron tunneling barrier height over ranges not possible via the thermal oxidation approach. This dissimilar contact metal may also function as a diffusion barrier. This may be required when high temperature treatments are used subsequently to increase the dielectric constant of the oxide.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A flash memory array, comprising:
    a number of non-volatile memory cells, wherein each non-volatile memory cell includes:
        a first source/drain region and a second source/drain region separated by a channel region;
        a floating gate opposing the channel region and separated therefrom by a gate oxide;
        a control gate opposing the floating gate; and
        wherein the control gate is separated from the floating gate by an asymmetrical low tunnel barrier intergate insulator, formed by atomic layer deposition, having a tunneling barrier of less than 2.0 eV, and having a number of small compositional ranges such that gradients can be formed which produce different barrier heights at an interface with the floating gate and control gate;
    a number of sourcelines coupled to the first source/drain regions along a first selected direction in the flash memory array;
    a number of control gate lines coupled to the control gates along a second selected direction in the flash memory array; and
    a number of bitlines coupled to the second source/drain regions along a third selected direction in the flash memory array.

2. The flash memory array of claim 1, wherein the asymmetrical low tunnel barrier intergate insulator includes a metal oxide insulator selected from the group consisting of $Al_2O_3$, $Ta_2O_5$, $TiO_2$, $ZrO_2$, $Nb_2O_5$, $SrBi_2Ta_2O_3$, $SrTiO_3$, $PbTiO_3$, and $PbZrO_3$.

3. The flash memory array of claim 1, wherein the floating gate includes a polysilicon floating gate having a metal layer formed thereon in contact with the asymmetrical low tunnel barrier intergate insulator.

4. The flash memory array of claim 3, wherein the control gate includes a polysilicon control gate having a metal layer formed thereon in contact with the asymmetrical low tunnel barrier intergate insulator, wherein the metal layer formed on the polysilicon control gate includes a metal layer that has a different work function than the metal layer formed on the floating gate.

5. The flash memory array of claim 4, wherein metal layer formed on the floating gate includes a parent metal for the asymmetrical low tunnel barrier intergate insulator and the metal layer formed on the control gate includes a metal layer having a work function in the range of 2.7 eV to 5.8 eV.

6. The flash memory array of claim 1, wherein the second selected direction and the third selected direction are parallel to one another and orthogonal to the first selected direction, and wherein the number of control gate lines serve as address lines.

7. The flash memory array of claim 1, wherein the first selected direction and the third selected direction are parallel to one another and orthogonal to the second selected direction, and wherein the number of control gate lines serve as address lines.

8. The flash memory array of claim 1, wherein the first selected direction and the second selected direction are parallel to one another and orthogonal to the third selected direction, and wherein the number of bitlines serve as address lines.

9. The flash memory array of claim 1, wherein the array includes a first logic plane connected to a second logic plane to form a programmable logic array, each logic plane including a plurality of cells programmed to respond to an input signal by outputting a sum-of-products term.

10. The flash memory array of claim 1, wherein the array is incorporated into a memory device that is coupled to a processor to form an electronic system.

11. An array of flash memory cells, comprising:
   a number of pillars extending outwardly from a substrate, wherein each pillar includes a first source/drain region, a body region, and a second source/drain region;
   a number of floating gates opposing the body regions in the number of pillars and separated therefrom by a gate oxide;
   a number of control gates opposing the floating gates;
   a number of buried sourcelines disposed below the number of pillars and coupled to the first source/drain regions along a first selected direction in the array of memory cells;
   a number of control gate lines formed integrally with the number of control gates along a second selected direction in the array of flash memory cells, wherein the number of control gates are separated from the floating gates by a low tunnel barrier intergate insulator, formed by atomic layer deposition, having a tunneling barrier of less than 2.0 eV, and having a number of small compositional ranges such that gradients can be formed by an applied electric field which produce different barrier heights at an interface with the floating gate and control gate; and
   a number of bitlines coupled to the second source/drain regions along a third selected direction in the array of flash cells.

12. The array of flash memory cells of claim 11, wherein the low tunnel barrier intergate insulator includes a metal oxide insulator selected from the group consisting of $Al_2O_3$, $Ta_2O_5$, $TiO_2$, $ZrO_2$, $Nb_2O_5$, $SrBi_2Ta_2O_9$, $SrTiO_3$, $PbTiO_3$, and $PbZrO_3$.

13. The array of flash memory cells of claim 11, wherein each floating gate includes a polysilicon floating gate having a metal layer formed thereon in contact with the asymmetrical low tunnel barrier intergate insulator.

14. The array of flash memory cells of claim 13, wherein each control gate includes a polysilicon control gate having a metal layer formed thereon in contact with the low tunnel barrier intergate insulator, wherein the metal layer formed on the polysilicon control gate includes a metal layer that has a different work function than the metal layer formed on the floating gate.

15. The array of flash memory cells of claim 14, wherein metal layer formed on the floating gate includes a parent metal for the asymmetrical low tunnel barrier intergate insulator and the metal layer formed on the control gate includes a metal layer having a work function in the range of 2.7 eV to 5.8 eV.

16. The array of flash memory cells of claim 11, wherein each floating gate is a vertical floating gate formed in a trench below a top surface of each pillar such that each trench houses a pair of floating gates opposing the body regions in adjacent pillars on opposing sides of the trench.

17. The array of flash memory cells of claim 16, wherein the plurality of control gate lines are formed in the trench below the top surface of the pillar and between the pair of floating gates, wherein each pair of floating gates shares a single control gate line, and wherein each floating gate includes a vertically oriented floating gate having a vertical length of less than 100 nanometers.

18. The array of flash memory cells of claim 16, wherein the plurality of control gate lines are formed in the trench below the top surface of the pillar and between the pair of floating gates such that each trench houses a pair of control gate lines each addressing the floating gates one on opposing sides of the trench respectively, and wherein the pair of control gate lines are separated by an insulator layer.

19. The array of flash memory cells of claim 16, wherein the plurality of control gate lines are disposed vertically above the floating gates, and wherein each pair of floating gates shares a single control gate line.

20. The array of flash memory cells of claim 16, wherein the plurality of control gate lines are disposed vertically above the floating gates, and wherein each one of the pair of floating gates is addressed by an independent one of the plurality of control gate lines.

21. The array of flash memory cells of claim 11, wherein each floating gate is a horizontally oriented floating gate formed in a trench below a top surface of each pillar such that each trench houses a floating gate opposing the body regions in adjacent pillars on opposing sides of the trench, and wherein each horizontally oriented floating gate has a vertical length of less than 100 nanometers opposing the body region of the pillars.

22. The array of flash memory cells of claim 21, wherein the plurality of control gate lines are disposed vertically above the floating gates.

23. A programmable logic array, comprising:
   a plurality of input lines for receiving an input signal;
   a plurality of output lines; and
   one or more arrays having a first logic plane and a second logic plane connected between the input lines and the output lines, wherein the first logic plane and the second logic plane comprise a plurality of logic cells arranged in rows and columns for providing a sum-of-products term on the output lines responsive to a received input signal, wherein each logic cell includes a vertical non-volatile memory cell including:

a first source/drain region formed on a substrate;
a body region including a channel region formed on the first source/drain region;
a second source/drain region formed on the body region;
a floating gate opposing the channel region and separated therefrom by a gate oxide;
a control gate opposing the floating gate; and
wherein the control gate is separated from the floating gate by a low tunnel barrier intergate insulator, formed by atomic layer deposition, having a tunneling barrier of less than 2.0 eV, and having a number of small compositional ranges such that gradients can be formed by an applied electric field which produce different barrier heights at an interface with the floating gate and control gate.

24. The programmable logic array of claim 23, wherein the asymmetrical low tunnel barrier intergate insulator includes a metal oxide insulator selected from the group consisting of $Al_2O_3$, $Ta_2O_5$, $TiO_2$, $ZrO_2$, $Nb_2O_5$, $SrBi_2Ta_2O_3$, $SrTiO_3$, $PbTiO_3$, and $PbZrO_3$.

25. The programmable logic array of claim 23, wherein the floating gate includes a polysilicon floating gate having a metal layer formed thereon in contact with the asymmetrical low tunnel barrier intergate insulator.

26. The programmable logic array of claim 23, wherein the control gate includes a polysilicon control gate having a metal layer formed thereon in contact with the asymmetrical low tunnel barrier intergate insulator, wherein the metal layer formed on the polysilicon control gate includes a metal layer that has a different work function than the metal layer formed on the floating gate.

27. The programmable logic array of claim 23, wherein metal layer formed on the floating gate includes a parent metal for the asymmetrical low tunnel barrier intergate insulator and the metal layer formed on the control gate includes a metal layer having a work function in the range of 2.7 eV to 5.8 eV.

28. An electronic system, comprising:
a processor; and
a memory device coupled to the processor, wherein at least one of the memory device and the processor includes an array of flash memory cells, comprising:
a number of pillars extending outwardly from a substrate, wherein each pillar includes a first source/drain region, a body region, and a second source/drain region;
a number of floating gates opposing the body regions in the number of pillars and separated therefrom by a gate oxide;
a number of control gates opposing the floating gates;
a number of buried sourcelines disposed below the number of pillars and coupled to the first source/drain regions along a first selected direction in the array of memory cells;
a number of control gate lines formed integrally with the number of control gates along a second selected direction in the array of flash memory cells, wherein the number of control gates are separated from the floating gates by a low tunnel barrier intergate insulator, formed by atomic layer deposition, having a tunneling barrier of less than 2.0 eV, and having a number of small compositional ranges such that gradients can be formed by an applied electric field which produce different barrier heights at an interface with the floating gate and control gate; and
a number of bitlines coupled to the second source/drain regions along a third selected direction in the array of flash cells.

29. The electronic system of claim 28, wherein the asymmetrical low tunnel barrier intergate insulator includes a metal oxide insulator selected from the group consisting of $Al_2O_3$, $Ta_2O_5$, $TiO_2$, $ZrO_2$, $Nb_2O_5$, $SrBi_2Ta_2O_3$, $SrTiO_3$, $PbTiO_3$, and $PbZrO_3$.

30. The electronic system of claim 28, wherein each floating gate includes a polysilicon floating gate having a metal layer formed thereon in contact with the low tunnel barrier intergate insulator.

31. The electronic system of claim 28, wherein each control gate includes a polysilicon control gate having a metal layer formed thereon in contact with the low tunnel barrier intergate insulator, wherein the metal layer formed on the polysilicon control gate includes a metal layer that has a different work function than the metal layer formed on the floating gate.

32. The electronic system of claim 31, wherein metal layer formed on the floating gate includes a parent metal for the asymmetrical low tunnel barrier intergate insulator and the metal layer formed on the control gate includes a metal layer having a work function in the range of 2.7 eV to 5.8 eV.

33. The electronic system of claim 28, wherein each floating gate is a vertical floating gate formed in a trench below a top surface of each pillar such that each trench houses a pair of floating gates opposing the body regions in adjacent pillars on opposing sides of the trench.

34. The electronic system of claim 33, wherein the plurality of control gate lines are formed in the trench below the top surface of the pillar and between the pair of floating gates, wherein each pair of floating gates shares a single control gate line, and wherein each floating gate includes a vertically oriented floating gate having a vertical length of less than 100 nanometers.

35. The electronic system of claim 33, wherein the plurality of control gate lines are formed in the trench below the top surface of the pillar and between the pair of floating gates such that each trench houses a pair of control gate lines each addressing the floating gates one on opposing sides of the trench respectively, and wherein the pair of control gate lines are separated by an insulator layer.

36. The electronic system of claim 33, wherein the plurality of control gate lines are disposed vertically above the floating gates, and wherein each pair of floating gates shares a single control gate line.

37. The electronic system of claim 33, wherein the plurality of control gate lines are disposed vertically above the floating gates, and wherein each one of the pair of floating gates is addressed by an independent one of the plurality of control lines.

38. The electronic system of claim 28, wherein each floating gate is a horizontally oriented floating gate formed in a trench below a top surface of each pillar such that each trench houses a floating gate opposing the body regions in adjacent pillars on opposing sides of the trench, and wherein each horizontally oriented floating gate has a vertical length of less than 100 nanometers opposing the body region of the pillars.

39. The electronic system of claim 38, wherein the plurality of control gate lines are disposed vertically above the floating gates.

40. A method for operating an array of flash memory cells, including operating a non-volatile memory cell, comprising:
writing to a floating gate of the non-volatile memory cell using channel hot electron injection, wherein the non-volatile memory cell includes:

a first source/drain region and a second source/drain region separated by a channel region in a substrate;
a floating gate opposing the channel region and separated therefrom by a gate oxide;
a control gate opposing the floating gate; and
wherein the control gate is separated from the floating gate by an asymmetrical low tunnel barrier intergate insulator, formed by atomic layer deposition, and having a number of small compositional ranges such that gradients can be formed by an applied electric field which produce different barrier heights at an interface with the floating gate and control gate;
erasing charge from the floating gate by tunneling electrons off of the floating gate and onto the control gate through the asymmetrical low tunnel barrier insulator.

41. The method of claim 40, wherein erasing charge from the floating gate by tunneling electrons off of the floating gate and onto the control gate further through the asymmetrical low tunnel barrier insulator includes:
providing a negative voltage to the substrate; and
providing a large positive voltage to the control gate.

42. The method of claim 40, wherein the method further includes writing to the floating gate by tunneling electrons from the control gate to the floating gate through the asymmetrical low tunnel barrier insulator.

43. The method of claim 42, wherein writing to the floating gate by tunneling electrons from the control gate to the floating gate through the asymmetrical low tunnel barrier insulator further includes:
applying a positive voltage to the substrate; and
applying a large negative voltage to the control gate.

44. The method of claim 40, wherein tunneling electrons from the floating gate to the control gate through the asymmetrical low tunnel barrier insulator includes tunneling electrons from the floating gate to the control gate through an asymmetrical low tunnel barrier insulator selected from the group consisting of $Al_2O_3$, $Ta_2O_5$, $TiO_2$, $ZrO_2$, $Nb_2O_5$, $SrBi_2Ta_2O_9$, $SrTiO_3$, $PbTiO_3$, and $PbZrO_3$.

45. The method of claim 40, wherein tunneling electrons from the floating gate to the control gate through the asymmetrical low tunnel barrier insulator includes tunneling electrons through the asymmetrical low tunnel barrier insulator having a barrier energy of approximately 2.0 eV.

46. The method of claim 40, wherein tunneling electrons from the floating gate to the control gate through the asymmetrical low tunnel barrier insulator includes tunneling electrons from a metal layer formed on the floating gate in contact with the low tunnel barrier intergate insulator to a metal layer formed on the control gate and also in contact with the low tunnel barrier intergate insulator.

47. A method for operating an array of flash memory cells, comprising:
writing to one or more floating gates for a number of non-volatile memory cells in the array of flash memory cells using channel hot electron injection, the array of flash memory cells includes:
a number of pillars extending outwardly from a substrate, wherein each pillar includes a first source/drain region, a body region, and a second source/drain region;
a number of floating gates opposing the body regions in the number of pillars and separated therefrom by a gate oxide;
a number of control gates opposing the floating gates;
a number of buried sourcelines disposed below the number of pillars and coupled to the first source/drain regions along a first selected direction in the array of memory cells;
a number of control gate lines formed integrally with the number of control gates along a second selected direction in the array of flash memory cells, wherein the number of control gates lines are separated from the floating gates by an asymmetrical low tunnel barrier intergate insulator, formed by atomic layer deposition, having a tunneling barrier of less than 2.0 eV, and having a number of small compositional ranges such that gradients can be formed by an applied electric field which produce different barrier heights at an interface with the floating gate and control gate; and
a number of bitlines coupled to the second source/drain regions along a third selected direction in the array of flash cells; and
erasing charge from the one or more floating gates by tunneling electrons off of the one or more floating gates and onto the number of control gates through the asymmetrical low tunnel barrier insulator.

48. The method of claim 47, wherein erasing charge from the one or more floating gates by tunneling electrons off of the floating gate and onto the number of control gate through the asymmetrical low tunnel bamer insulator further includes:
providing a negative voltage to a substrate of one or more non-volatile memory cells; and
providing a large positive voltage to the control gate for the one or more non-volatile memory cells.

49. The method of claim 48, wherein the method further includes erasing an entire row of non-volatile memory cells by providing a negative voltage to all of the substrates along an entire row of non-volatile memory cells and providing a large positive voltage to all of the control gates along the entire row of non-volatile memory cells.

50. The method of claim 48, wherein the method further includes erasing an entire block of non-volatile memory cells by providing a negative voltage to all of the substrates along multiple rows of non-volatile memory cells and providing a large positive voltage to all of the control gates along the multiple rows of non-volatile memory cells.

* * * * *

UNITED STATES PATENT AND TRADEMARK OFFICE
CERTIFICATE OF CORRECTION

PATENT NO. : 7,473,956 B2  Page 1 of 1
APPLICATION NO. : 10/929986
DATED : January 6, 2009
INVENTOR(S) : Eldridge et al.

It is certified that error appears in the above-identified patent and that said Letters Patent is hereby corrected as shown below:

On the title page, item (54), in column 1, line 2, delete "Assymmetrical" and insert -- Asymmetrical --, therefor.

On the title page, item (74), in "Attorney, Agent or Firm", in column 2, lines 1-2, delete ", Woessner & Kluth," and insert -- & Woessner, --, therefor.

In column 1, line 2, delete "Assymmetrical" and insert -- Asymmetrical --, therefor.

In column 1, line 11, before "which" insert -- now Pat. No. 7,042,043 --.

In column 18, line 47, in Claim 1, delete "bamer" and insert -- barrier --, therefor.

In column 19, line 57, in Claim 11, delete "bamer" and insert -- barrier --, therefor.

In column 23, line 42, in Claim 45, delete "bamer" and insert -- barrier --, therefor.

In column 24, line 36, in Claim 48, delete "bamer" and insert -- barrier --, therefor.

Signed and Sealed this

Fifth Day of May, 2009

JOHN DOLL
*Acting Director of the United States Patent and Trademark Office*